United States Patent [19]

Goldstein et al.

[11] 4,380,767
[45] Apr. 19, 1983

[54] CONTROLLED ANTENNA TUNER

[75] Inventors: Kenneth Goldstein; Claude A. Sharpe, both of Plano, Tex.

[73] Assignee: Texas Instruments Incorporated, Dallas, Tex.

[21] Appl. No.: 200,833

[22] Filed: Oct. 27, 1980

[51] Int. Cl.³ .......................................... H04B 17/00
[52] U.S. Cl. ..................................... 343/745; 455/123
[58] Field of Search ....................... 343/745, 854, 703; 455/121, 123, 283

[56] References Cited

U.S. PATENT DOCUMENTS 3,381,222  4/1968  Gray ................................... 343/703
3,818,480  6/1974  West ................................... 343/845

Primary Examiner—Eli Lieberman
Attorney, Agent, or Firm—Rene' E. Grossman; Melvin Sharp; James T. Comfort

[57] ABSTRACT

A controlled antenna tuner comprises a power amplifier and a microprocessor, an attenuator connected to the power amplifier for selectively controlling the power output, a low pass filter connected to the power amplifier and microprocessor for channel frequency selection, a vertical standing wave ratio (VSWR) circuit inductively connected to the low pass filters output for determining the VSWR of the antenna, an impedance (magnitude) bridge and a phase detector bridge selectively connected to the low pass filter RF output and to the microprocessor for sensing the tuning status of an antenna, and an LC tuner network connected to the phase detector bridge and microprocessor, the microprocessor processing outputs of the impedance and phase detector bridges into tuning signals for the LC tuner to tune the antenna to the selected channel and storing the tuning signals for the selected channel for future use.

10 Claims, 26 Drawing Figures

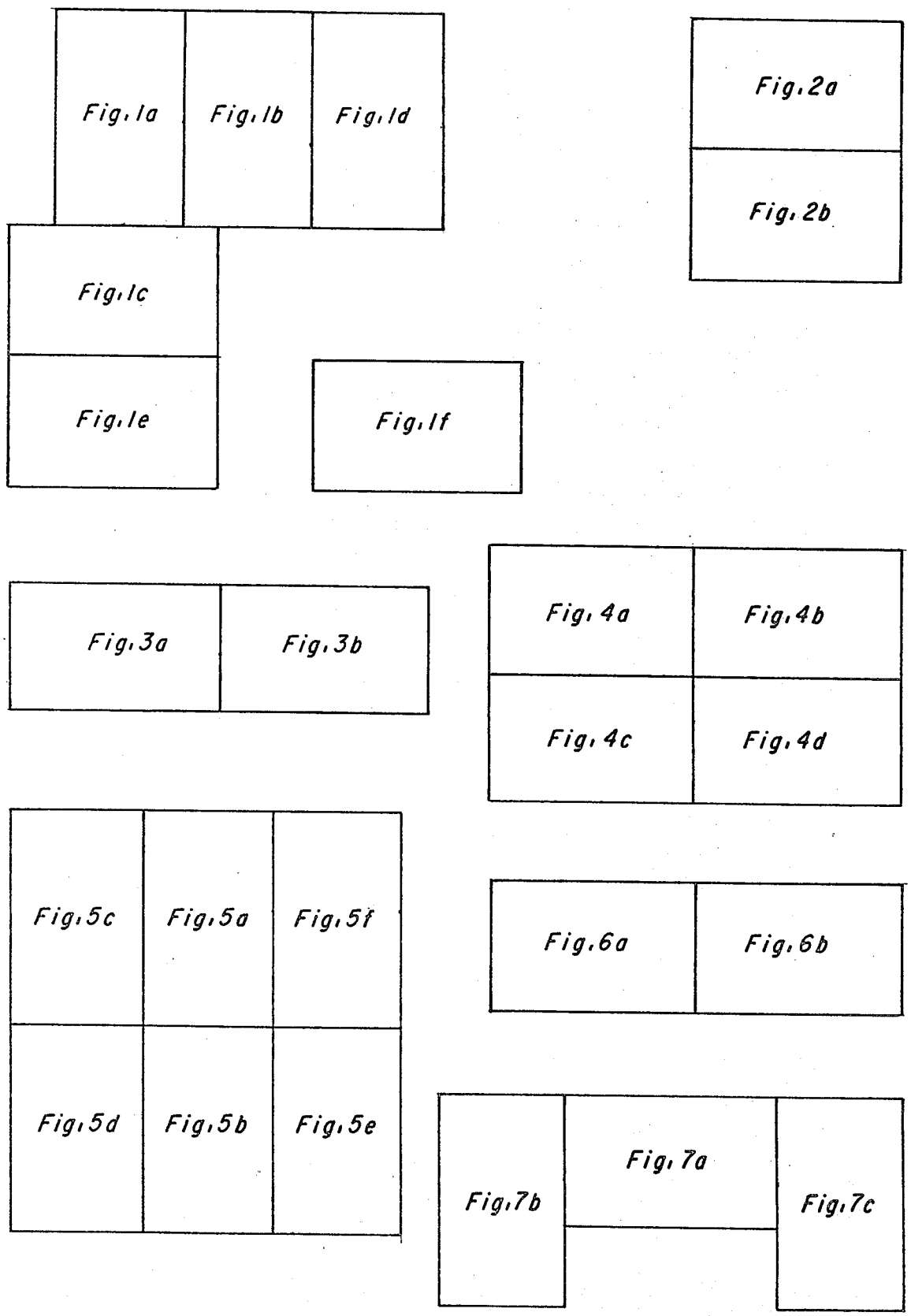

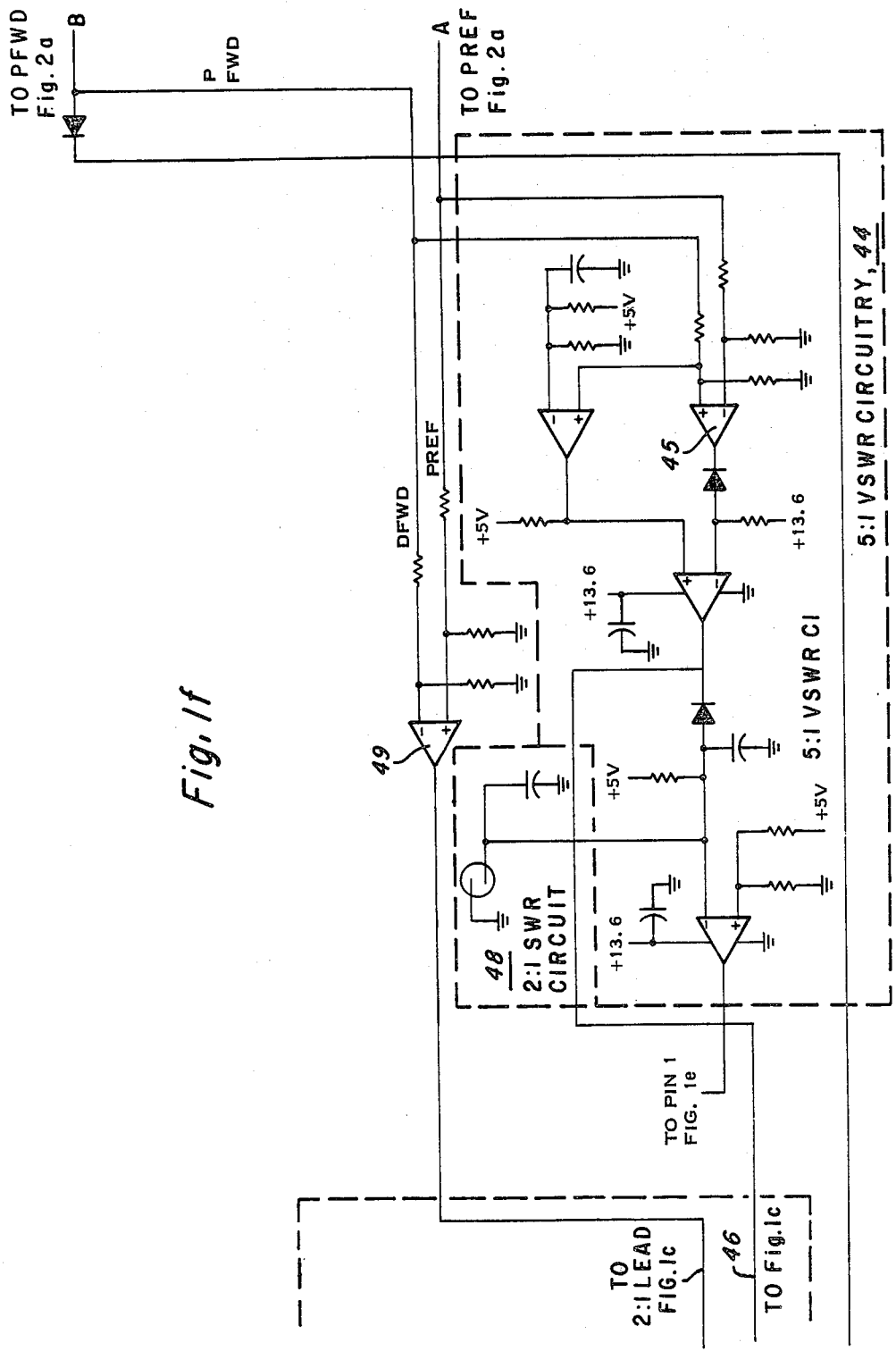

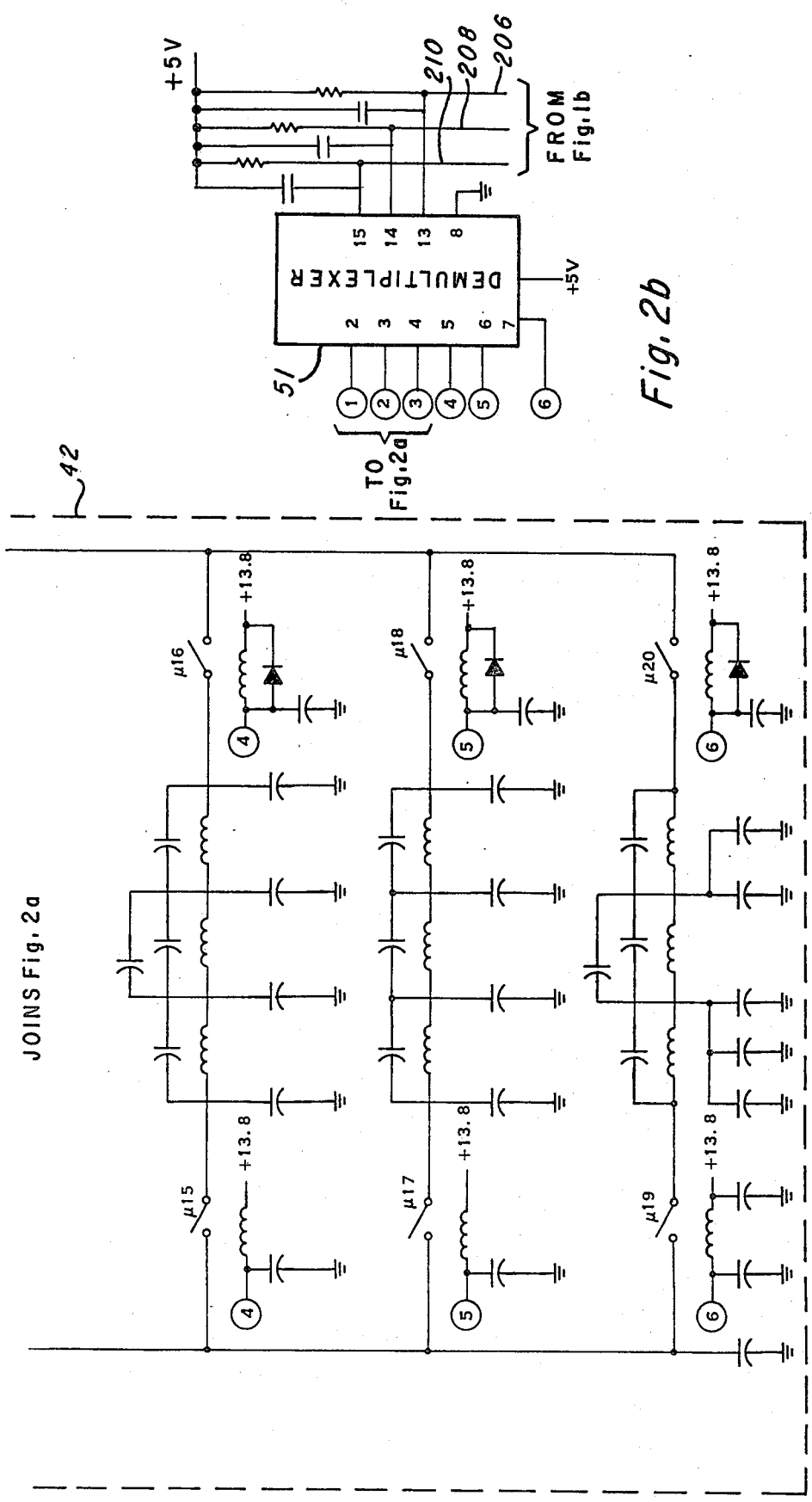

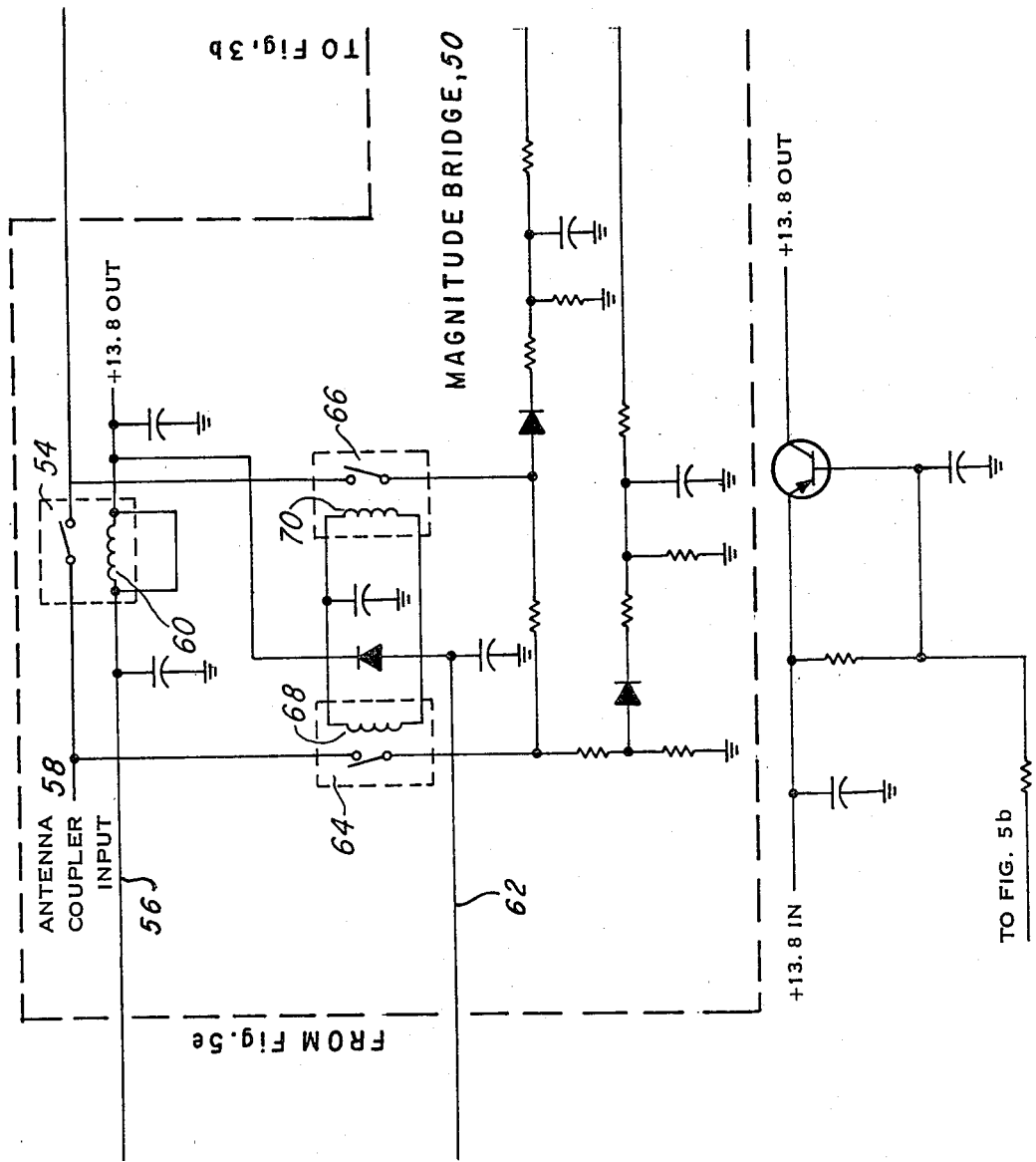

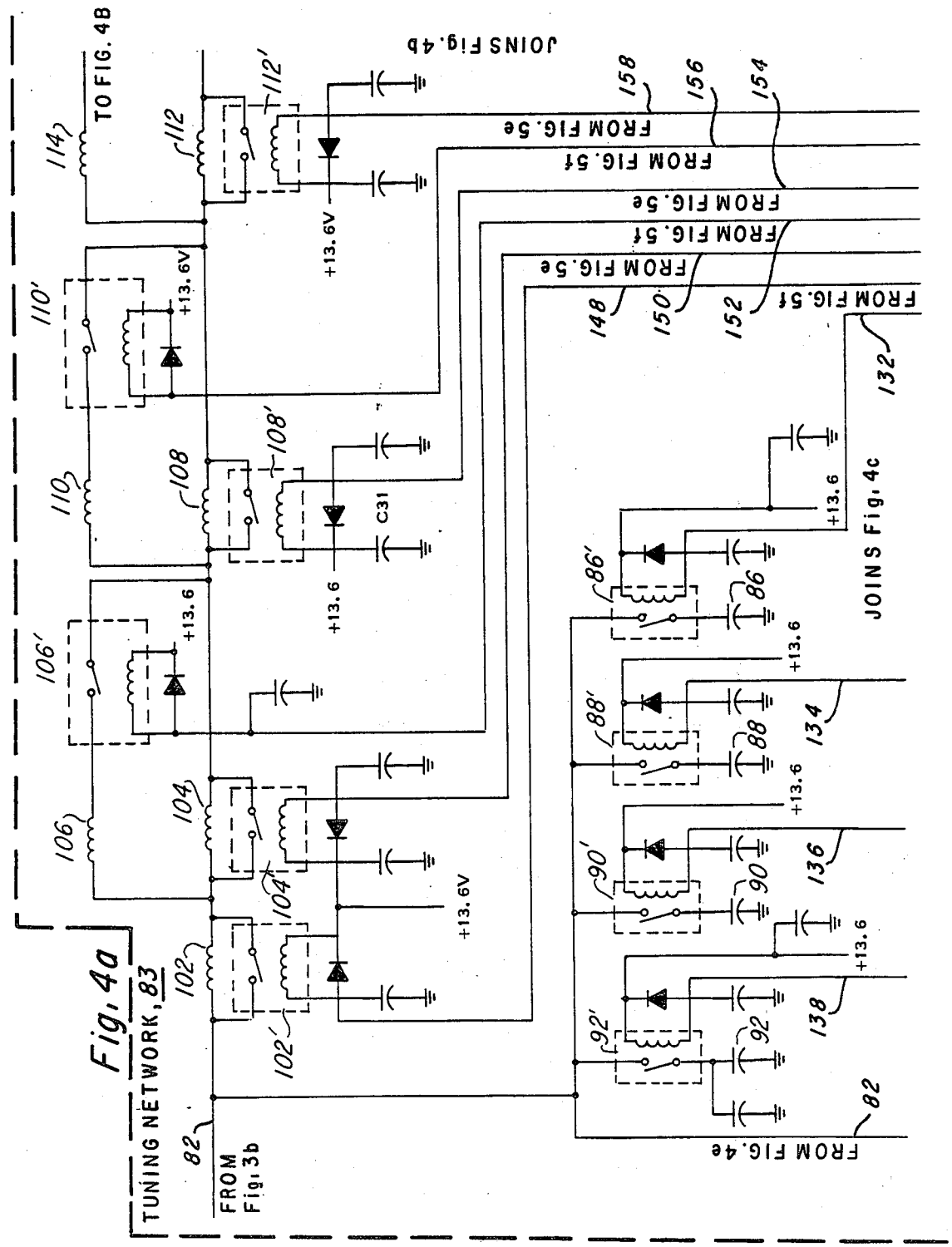

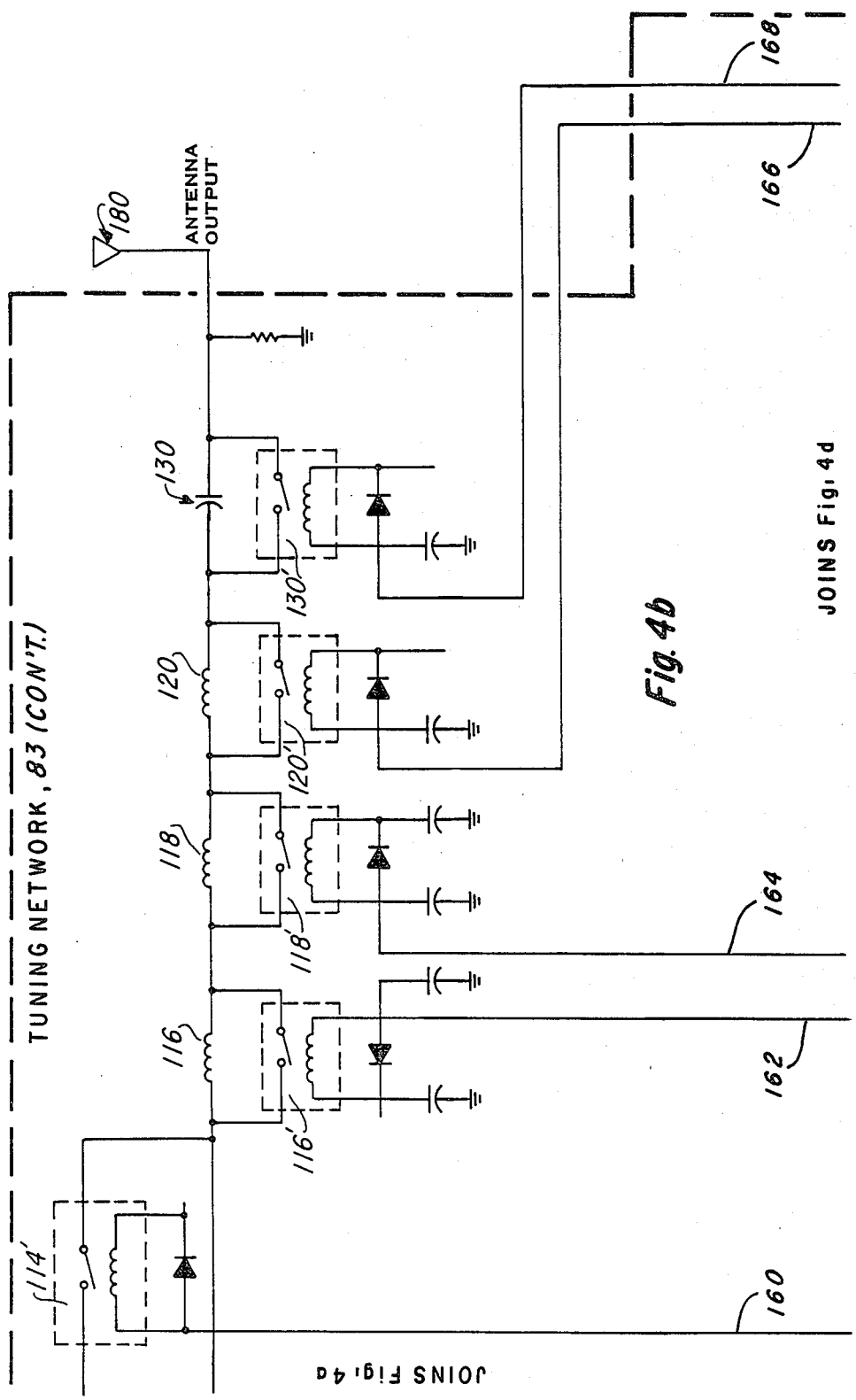

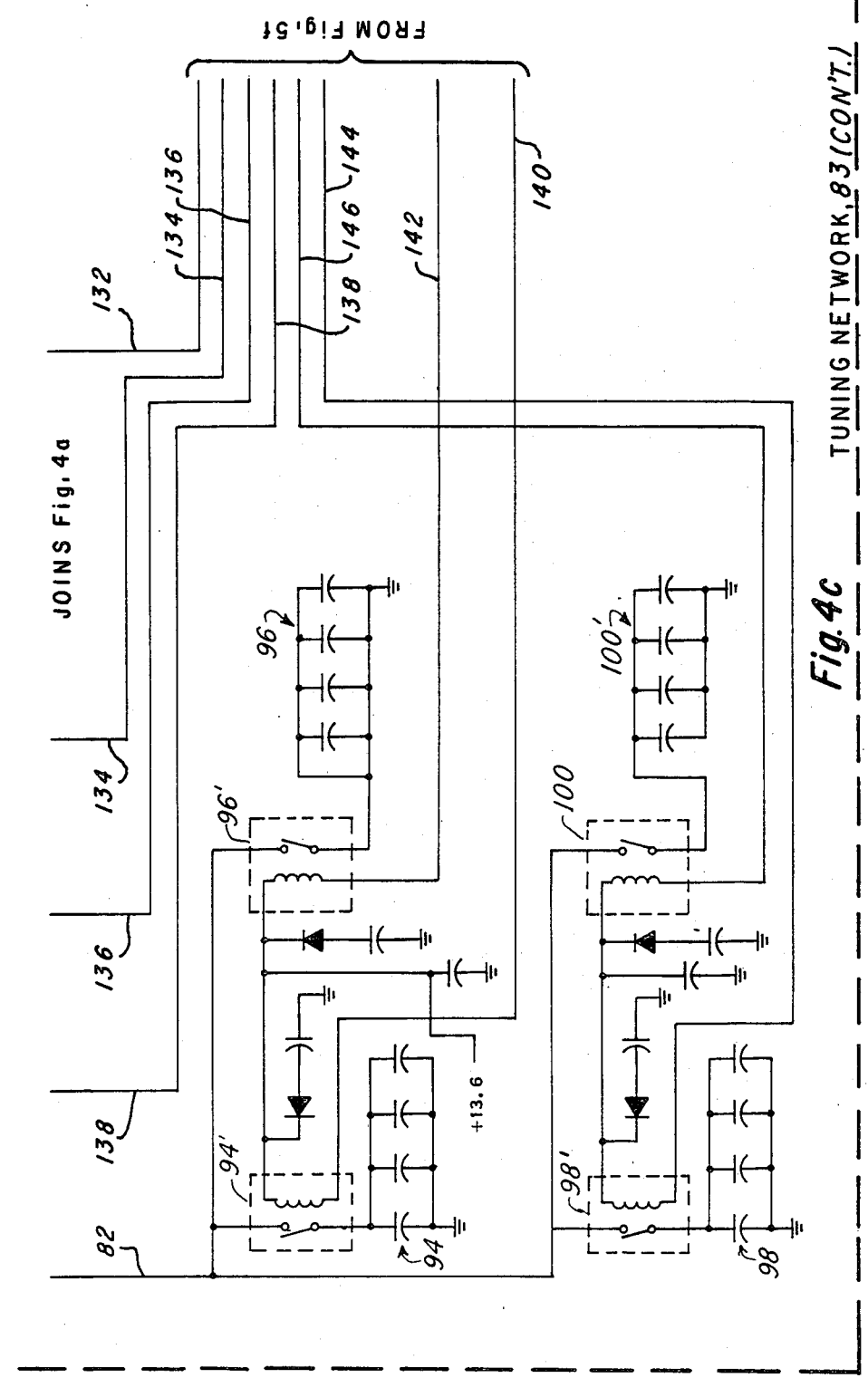

JOINS Fig. 5e

CONTROLLED ANTENNA TUNER

This invention relates to RF antenna tuners and more particularly to an automatically controlled antenna tuner.

In the past, antenna couplers have incuded band-switched LC tuned antenna couplers, relay switched LC tuned antenna couplers, and autotransformer/series reactance antenna couplers. These antenna couplers are described by Dean Straw in his article "Antenna Couplers for Marie Single Sideband" (NMEA News Sept./Oct 1978, beginning at p. 11). These systems have two principal disadvantages. First, the initial tuning adjustments must be done by an experienced technician and are very time consuming; and secondly, hardware modifications are necessary if any change is made in the antenna system or an alternate channel frequency must be accommodated.

Further, past antenna tuning techniques have utilized a SWR bridge technique to determine tuning results. However, the VSWR minimum is such that it is very difficult to determine when to stop increasing the inductance (L) and begin inserting the reactive element. Thus any high VSWR condition which uses an initial series inductance (L) or shunt capacitance (C) algorithm would supply little information to a measuring circuit.

Accordingly it is an object of the present invention to provide an effective, economical antenna tuner which minimizes the time for tuning an antenna system.

Another object of the invention is to provide an antenna tuner using highly sensitive tuning sensors for fine tuning an antenna system.

A further object of the invention is to provide an antenna tuner having the capability of determining the steps necessary to tune an antenna system and implementing these steps automatically.

Briefly stated the invention comprises a microprocessor controlled antenna tuner having a phase measuring means and an impedance measuring means, a microprocessor, and a plurality of inductance (L)/capacitance (C) networks. The phases measuring means and impedance measuring means are connected to the microprocessor for providing tuning information (data). The microprocessor selectively determines the values of inductance, and capacitance to be added to provide a fifty ohm plus system tolerance impedance. The microprocessor stores the final tuning values for each channel for use with channel selection, and has a loss of tuning circuit with indicator.

The novel features believed to be characteristic of this invention are set forth in appended claims. The invention itself, however, as well as other objects and advantages thereof may best be understood by reference to the following detailed description of an illustrative embodiment when read in conjunction with the accompanying drawings in which:

FIG. 0 is a block diagram showing the arrangement of the following Figures.

FIGS. 1a-1f are schematic diagrams of the antenna unit's power amplifier and related circuits;

FIGS. 2a-2b are schematic diagrams of the antenna unit's low pass filter (LPF) networks;

FIGS. 3a-3b are schematic diagrams of the antenna unit's sensor;

FIGS. 4a-4d are schematic diagrams of the antenna unit's tuning network;

Figure 1A:
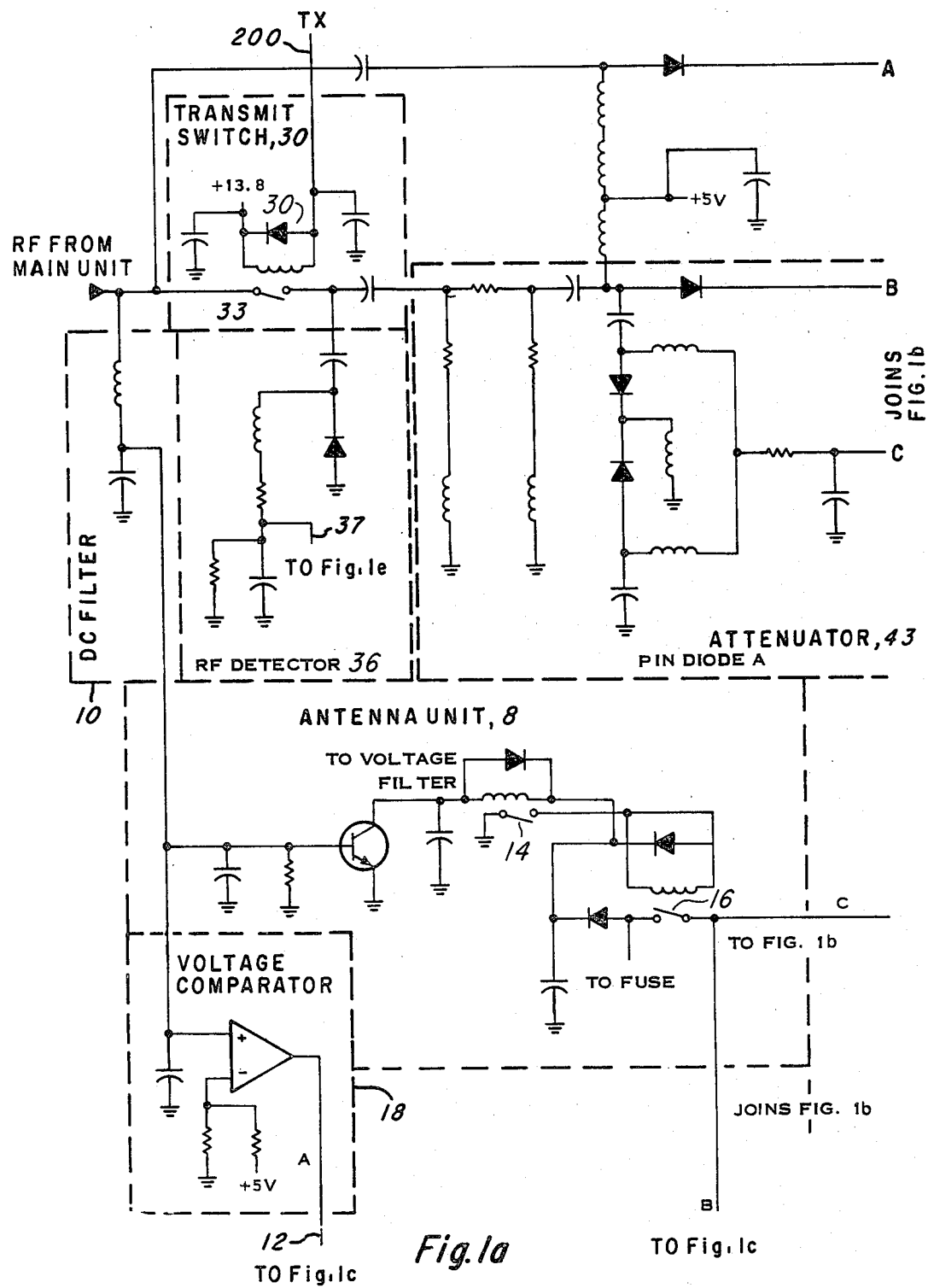

The antenna coupling unit connects to the output of the main transceiver unit, a TI-3000 marine radio telephone (not shown) manufactured and sold by Texas Instruments Incorporated. At turn on of the main unit for transmission, a 13.8 V dc and any radio frequency (RF) appears at the junction of a dc filter 10 (FIG. 1a), voltage comparator 18, and power actuating switches 14 and 16 of the antenna unit 8. The dc filter 10 filters out any RF and passes the dc to the comparator 18 where it is compared to a reference voltage. If the dc exceeds the reference voltage, a transmit output signal is applied to the transmit dc (TDC) terminal 12 (FIGS. 1a, 1c, & 5c) of an input multiplexer 190 (FIG. 5c) of the antenna unit controller board. The multiplexer inputs the TDC signal to the microprocessor 182 (FIGS. 5a & 5b) and a power amplifier bias signal from pin 7 of microprocessor 182 (FIG. 5b) is outputted through terminal 196 (FIG. 5b & 1c) to power amplifier bias and voltage regulator circuit 20 (FIG. 1b). The bias is connected to the base of a transistor switch 21. The antenna unit 8 (FIG. 1a) upon the closing of switches 14 and 16 by the output of dc filter 10 grounds a 13.6 V power circuit to provide 13.6 V to all 13.6 V terminals of the antenna coupling unit including a first voltage regulator 23 (+5 V) and to the emitter of transistor switch 21 of the power amplifier voltage regulator circuit 20. When bias is present switch 21 provides 13.6 V to a second voltage regulator 25 (+8.5 V). The +8.5 V voltage regulator and the +5 V voltage regulator are connected to the power amplifier to power it on during the transmit and off during receive for conservation of power during receive.

Figure 1B:
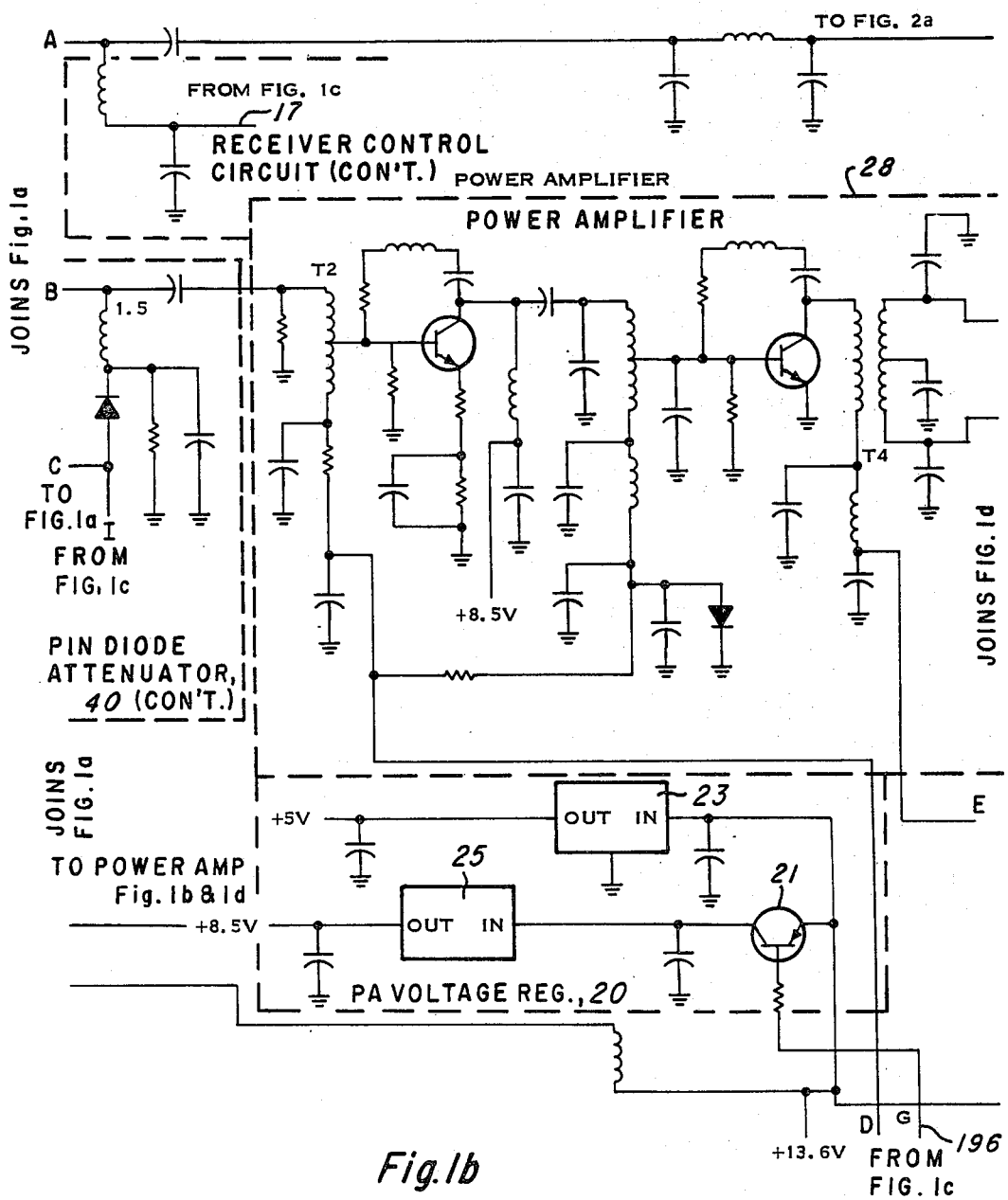

A transmit indicating logic signal from terminal 200 (FIG. 5b) is applied simultaneously to a transmit switch 30 (FIG. 1a) on the transmitter side of the power amplifier, and to the switching coils of switches 31 and 34 of the T/R switch 32 (FIG. 2a) on the antenna side of the power amplifier through receiver control circuit 17 (FIGS. 1c & 1b) to close switches 30 and 31 while switch 34 is opened during transmission. For receive, a receive logic signal 198 (FIG. 5b) is applied to the coils of the T/R switch 32 (FIG. 2a) and transmit switch 30 (FIG. 1a) to open switches 31 and 33 and to close switch 34 to pass the incoming RF around the power amplifier. During receive an attenuator driver 40 (FIGS. 1e & 1c) drives the diodes of attenuator 43 (FIGS. 1a and 1b) through lead I (FIG. 1c) to revert the power amplifier 28 (FIGS. 1b & 1d) to a zero power status.

When a transmit signal is received through terminal 200 (FIG. 5b), the TX switch 30 (FIG. 1a) and T/R switch 31 (FIG. 2a) close to switch in the power amplifier 28. At which time, the attenuator driver 40 (FIGS. 1c & 1e) acts to adjust the energy to the power amplifier to provide a 125 W transmitter output.

An RF detector circuit 36 (FIG. 1a) is connected between the TX switch 30 and the pin diode attenuator 43. The RF detector searches the RF input line for RF signals. The output of the RF detector is connected by lead 37 to a sample and hold (S & H) circuit 38 (FIG. 1e). The S & H circuit 38 is connected to the attenuator driver 40 for generating a first attenuator time constant signal when no RF is detected after a one second period. The S & H circuit 38 is also connected through lead B to a ramp control circuit 22 (FIG. 1c) to provide a reset signal to reset the ramp control circuit to its initial state. The ramp control circuit is connected to the power amplifier 28 (FIG. 1b) through lead D which reduces the gain of the power amplifier to control the rate of its turn on commensurate to the automatic lever control.

Figure 1C:
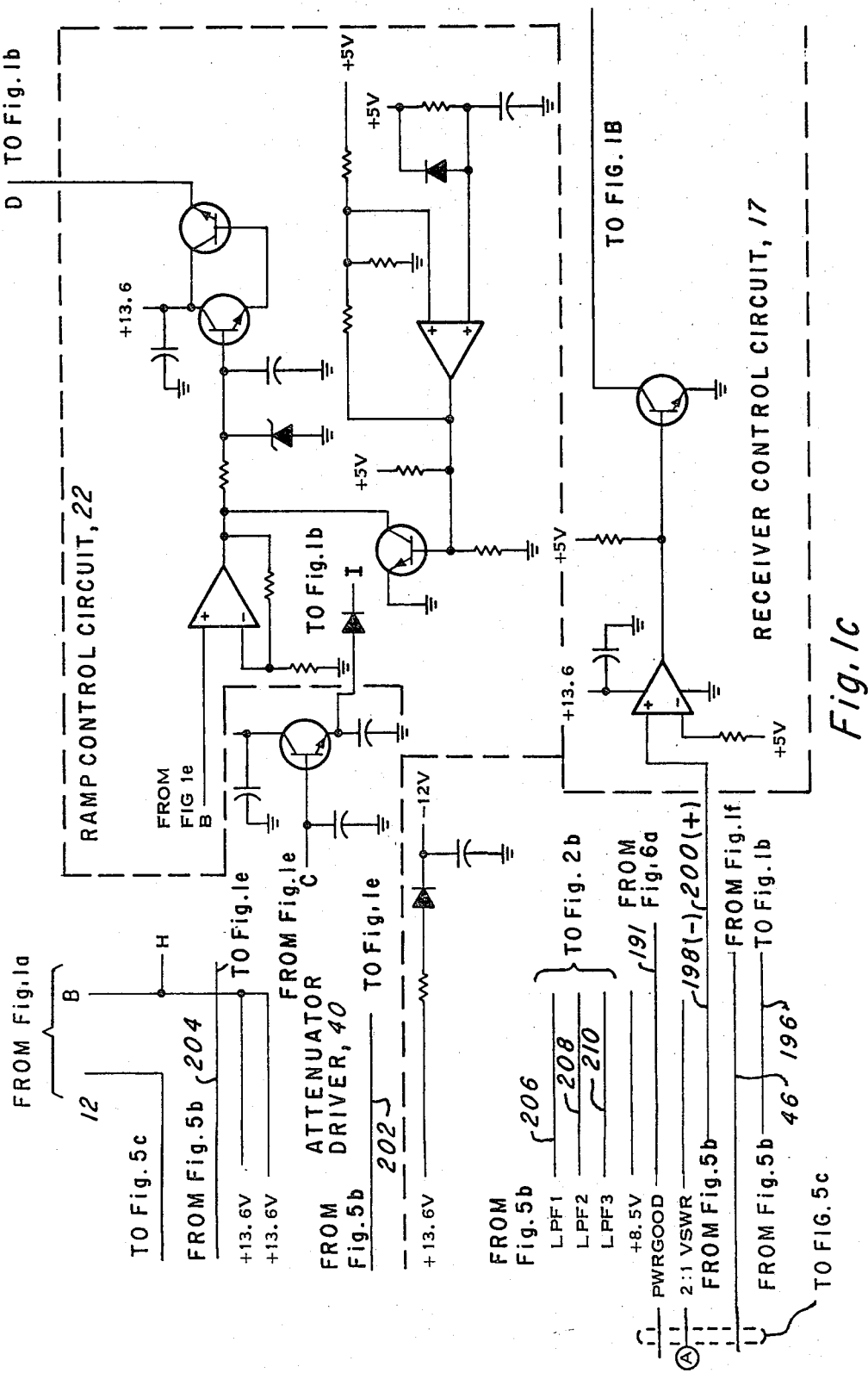
Figure 1D:
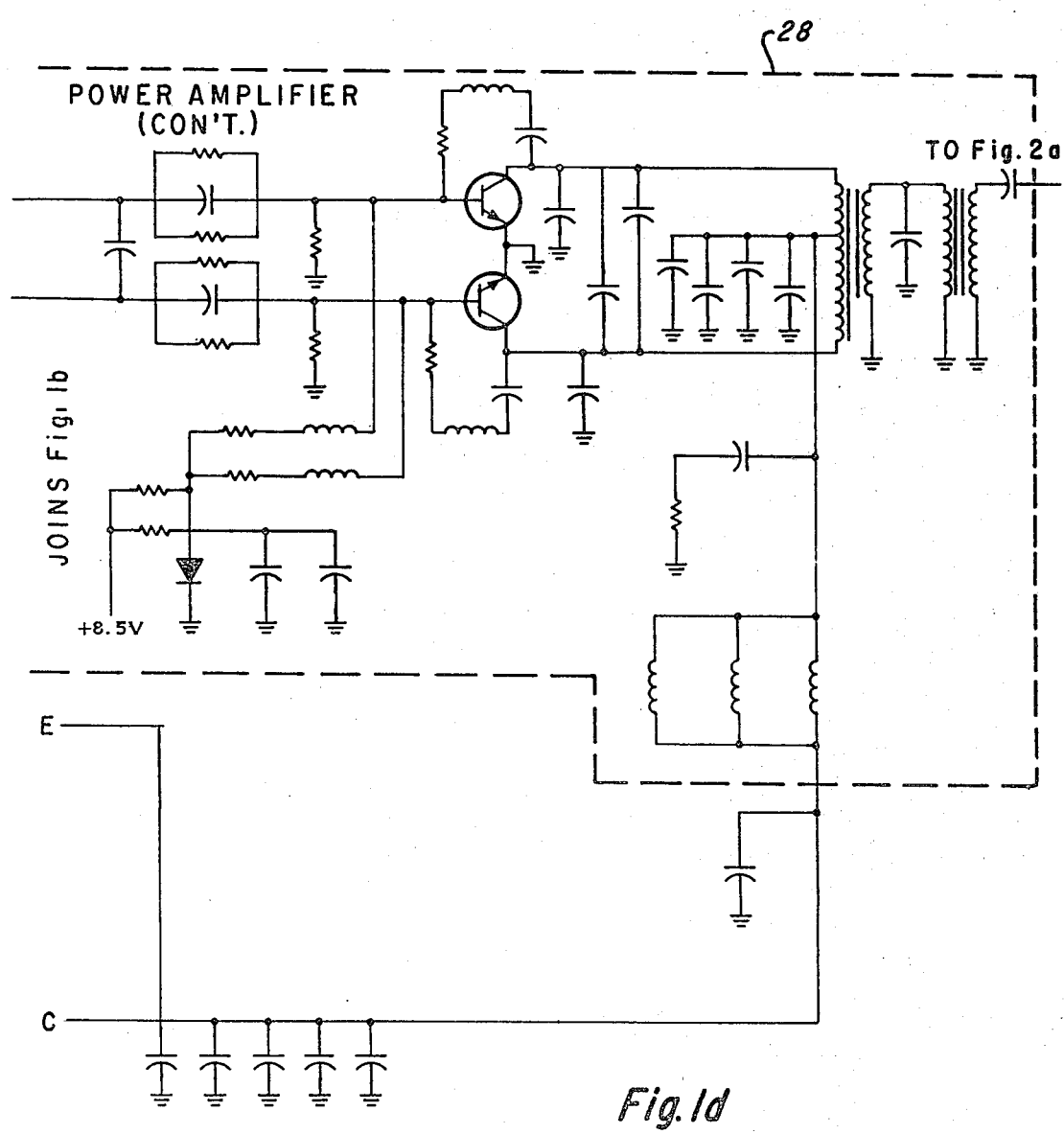
Figure 1E:
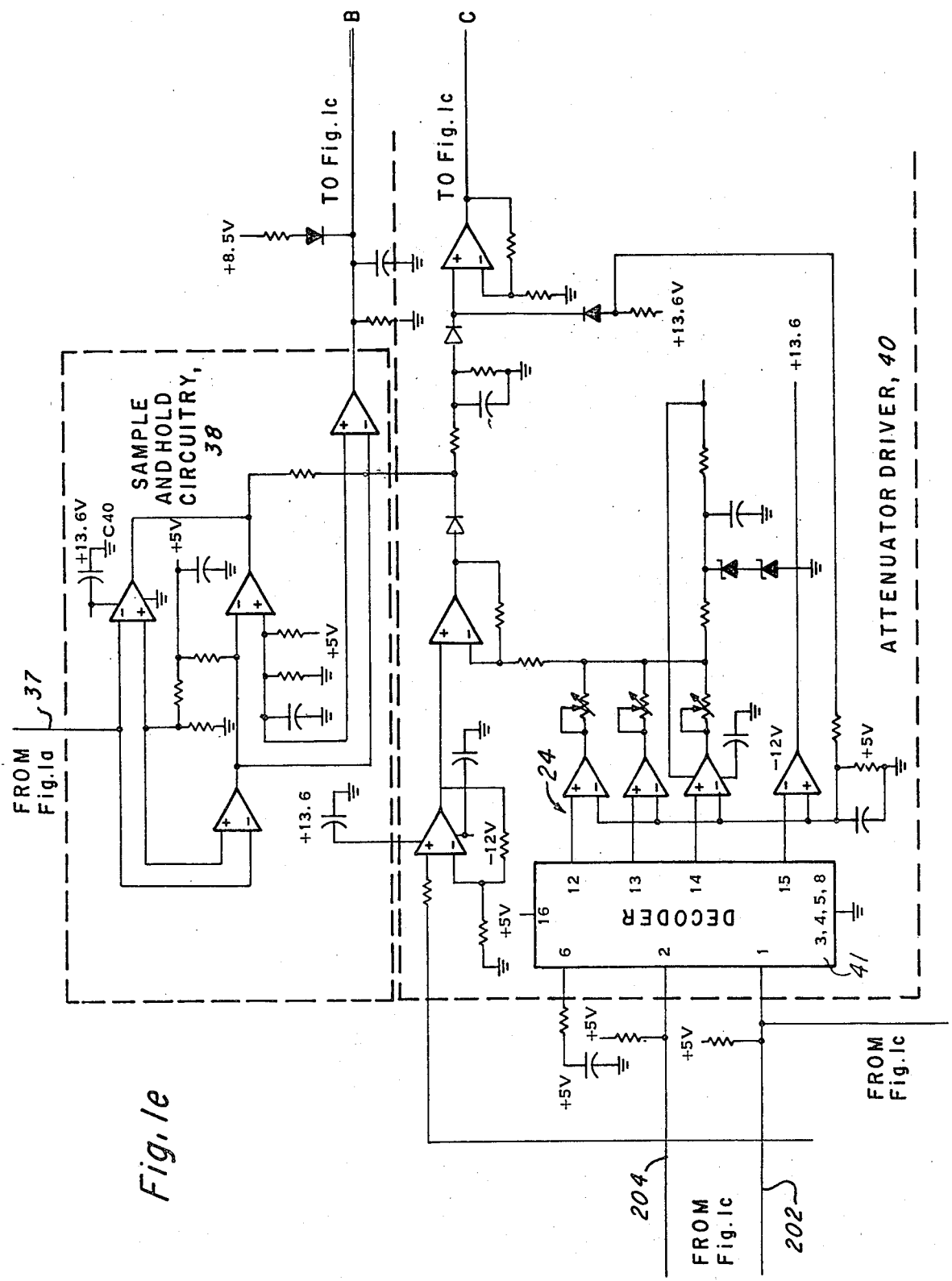
Figure 2A:
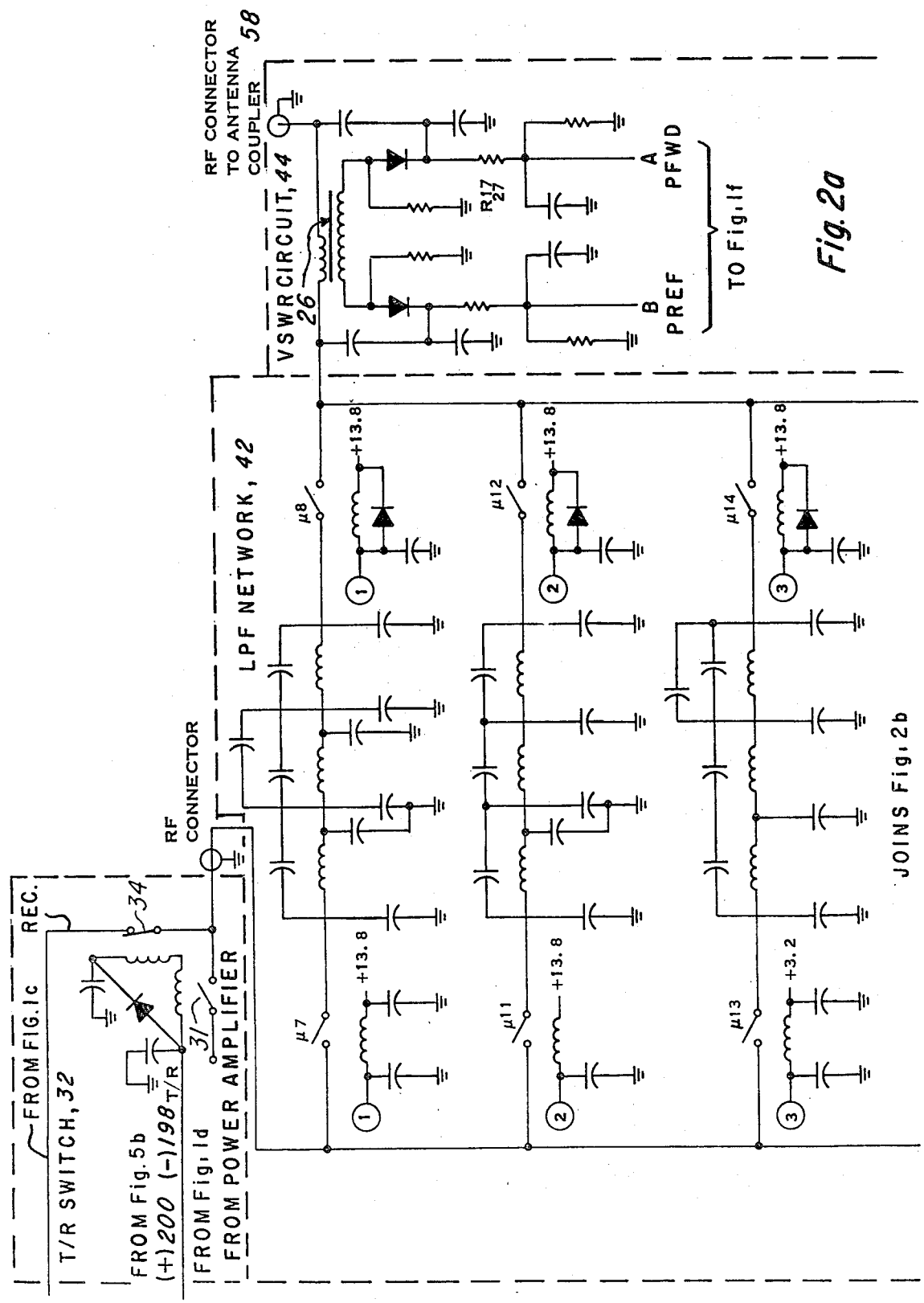
Figure 5A:
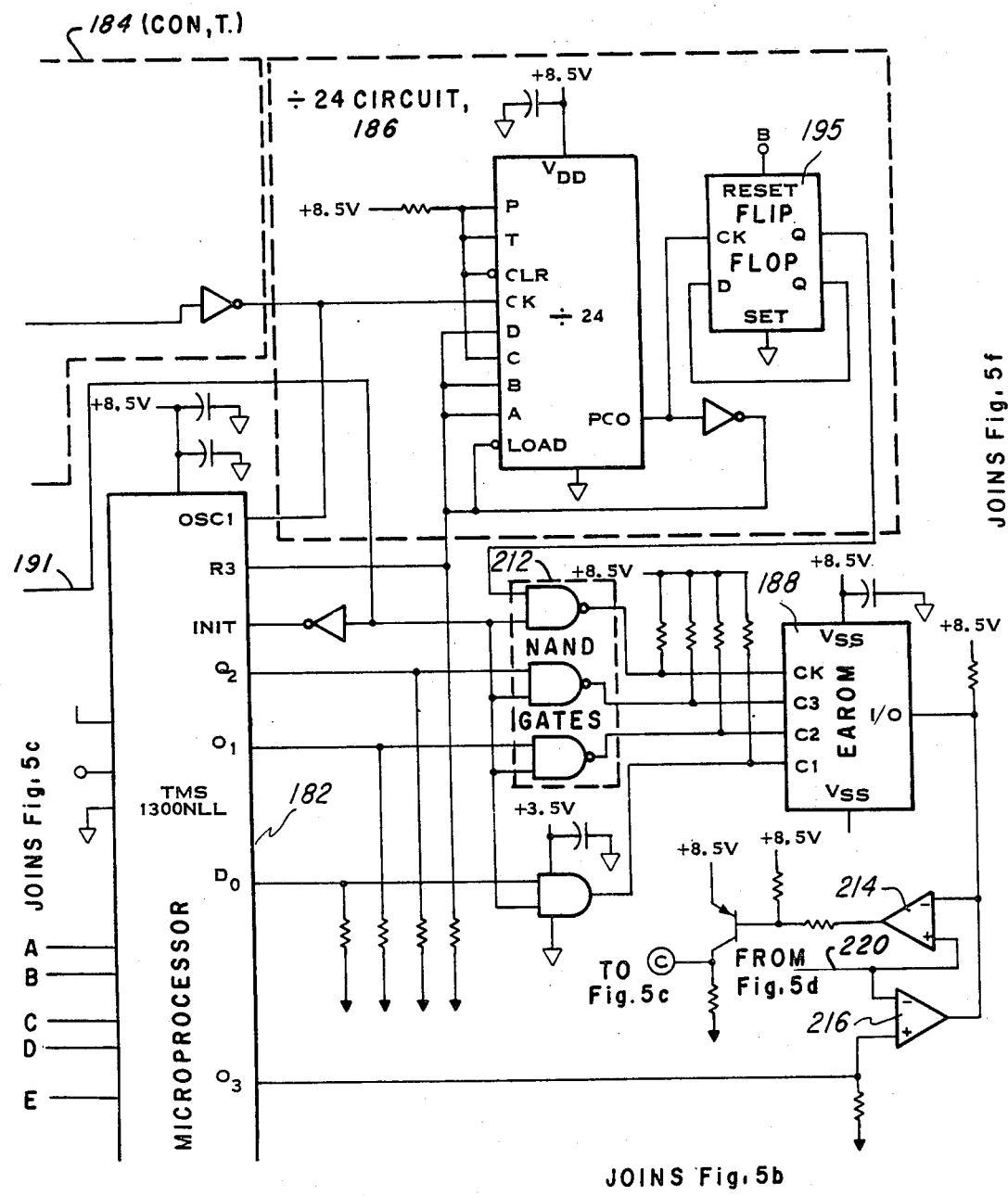
FIGS. 5a-5f are schematic diagrams of the antenna unit's microprocessor printed wiring board.
Figure 5B:
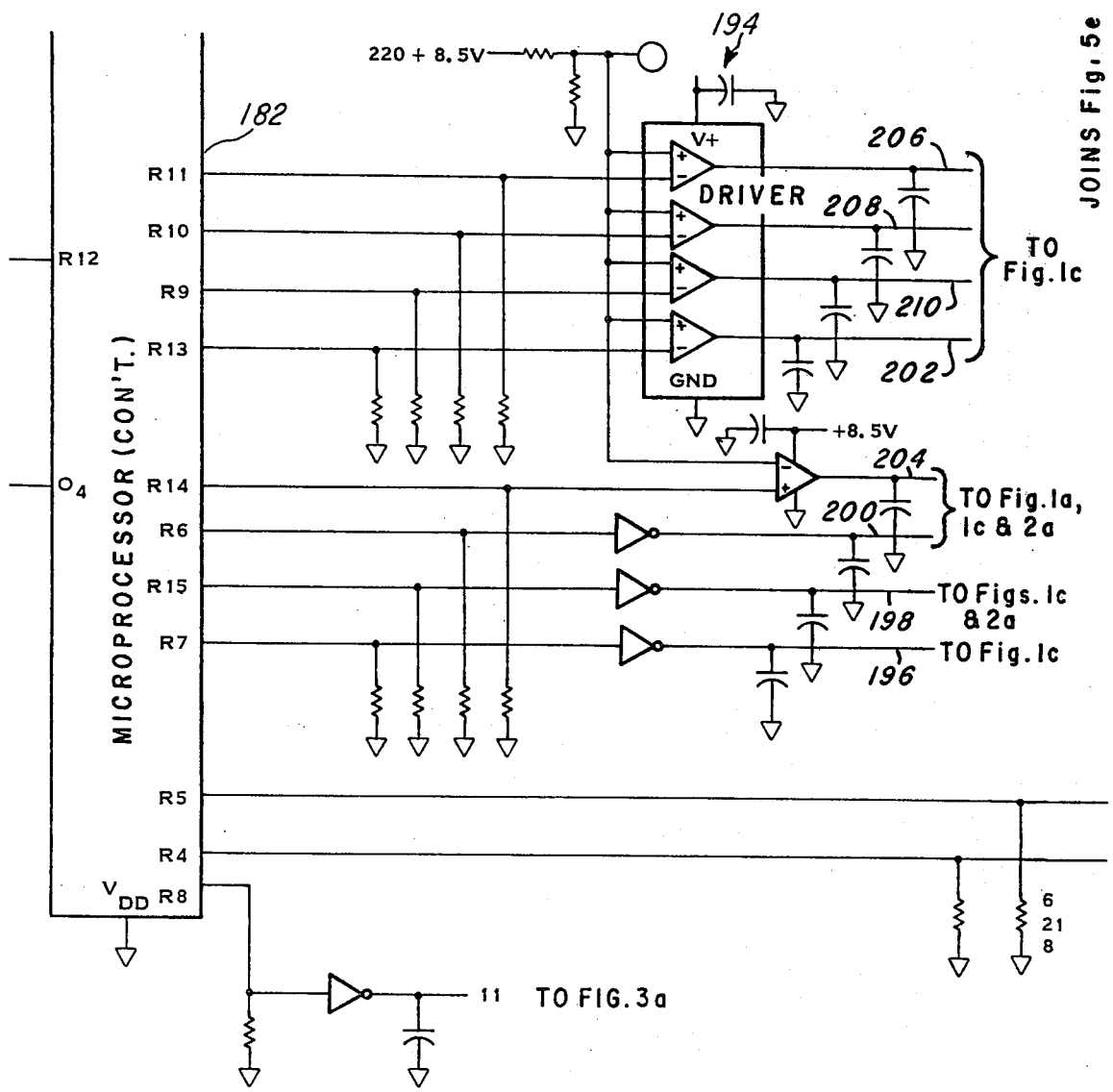

The attenuator driver 40 (FIGS. 1e and 1c) is connected to the microprocessor's four bit output terminals 202 and 204 (FIGS. 5b, 1c & 1e). The signals are decoded by decoder 41 (FIG. 1e) and applied to drivers 24 to control through lead C the attenuator 43 (FIGS. 1a and 1b) to provide 125 W, 50 W, 2 W, and full attenuation (during receive) of the power amplifier (PA) through leads I and C (FIG. 1b).

The power amplifier (PA) 28 (FIGS. 1b & 1d) is a linear amplifier whose power output is controlled by the pin diode attenuator 43 through lead B (FIGS. 1a & 1b).

Filters of a low pass filter network 42 (FIGS. 2a & 2b) are connected to the T/R switch 32 through reed relay operated switches in $\mu 7$, $\mu 8$, and $\mu 11$-$\mu 20$. The coils of these switches are controlled by demultiplexer 51 (FIG. 2b) connected to the microprocessor's 8 bit output low pass filter (LPF) terminals 206, 208 and 210 (FIGS. 5b & 1c) for channel frequency selection.

Figure 5C:
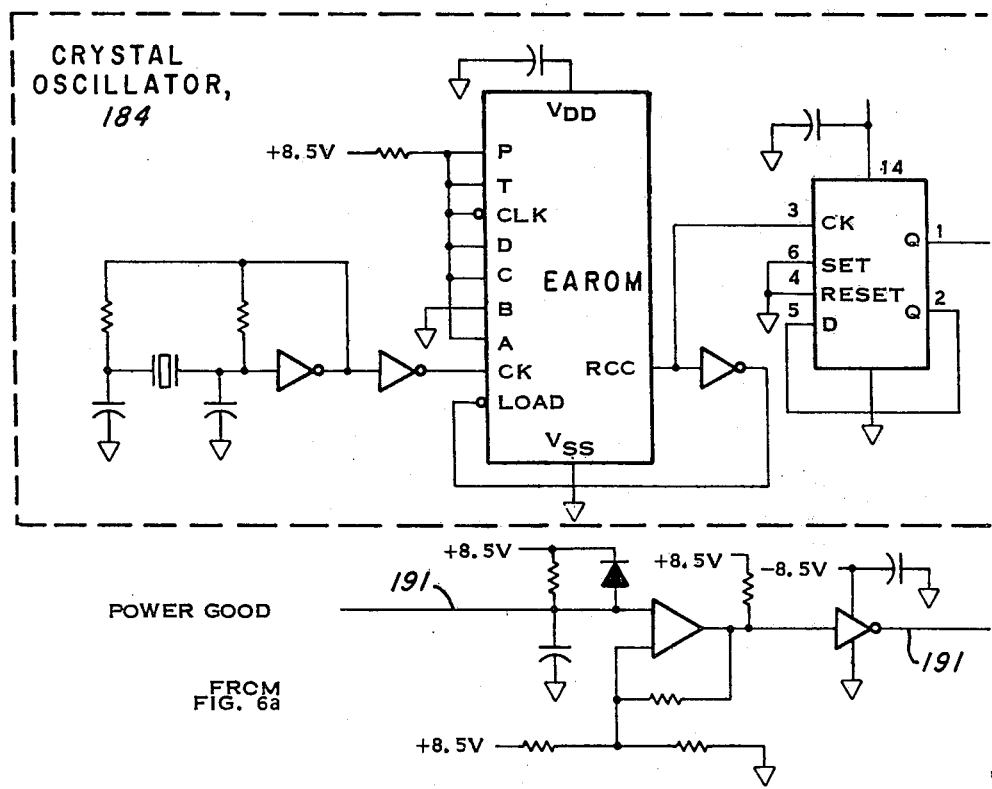
Figure 5C:
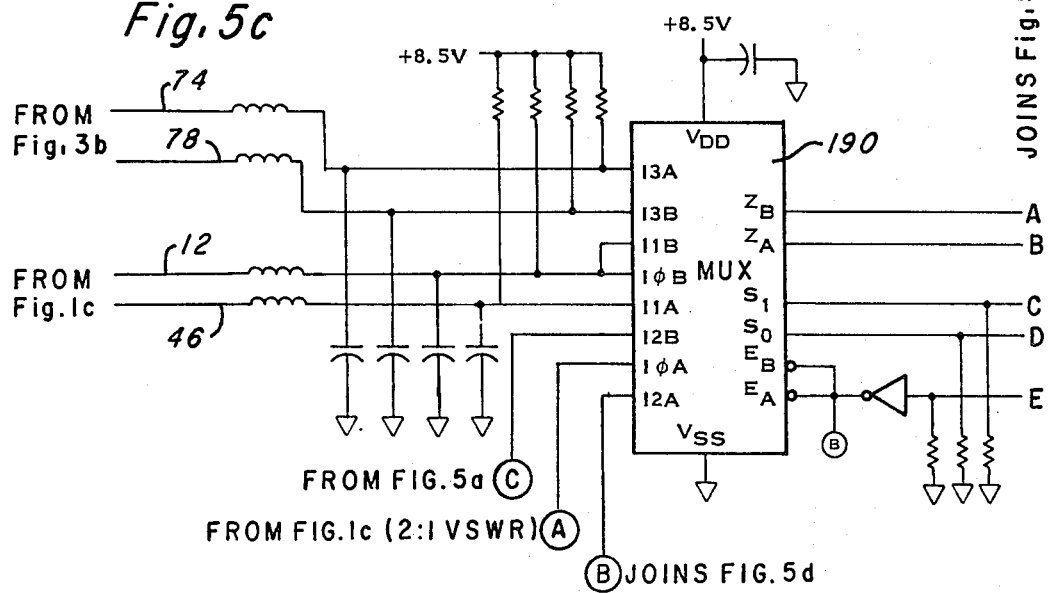

A vertical standing wave ratio (VSWR) calculating circuit 44 (FIGS. 2a & 1f) is inductively connected by a transformer 26 (FIG. 2a) to the low pass filter network 42 output. To calculate the VSWR, the reflective power (PREF) and forward power (PFWD) are sampled in a comparator 45 (FIG. 1f) and when the VSWR exceeds a 5:1 ratio the microprocessor (FIGS. 5a and 5b) is signaled through lead 46 (FIG. 1c) and multiplexer 190 (FIG. 5c). The microprocessor through lead 202 (FIGS. 5b and 1c) then signals the attenuator driver 40 (FIGS. 1c & 1e) to cut the power amplifier output to fifty watts to prevent transistor damage and flashes the tuning signal of the main unit.

A VSWR circuit, circuit 48 (FIG. 1f) for determining a VSWR of 2:1 is also provided. The circuit includes a comparator 49 having its input connected through leads A and B (FIGS. 1f and 2a) to the power reflected and power forward output of the VSWR circuit 44 (FIG. 2a) and its output connected through the 2:1 VSWR lead (FIG. 1c) to pin 12b of multiplexer 190 (FIG. 5c). The VSWR circuits provide a check for tuner operation.

Figure 3B:
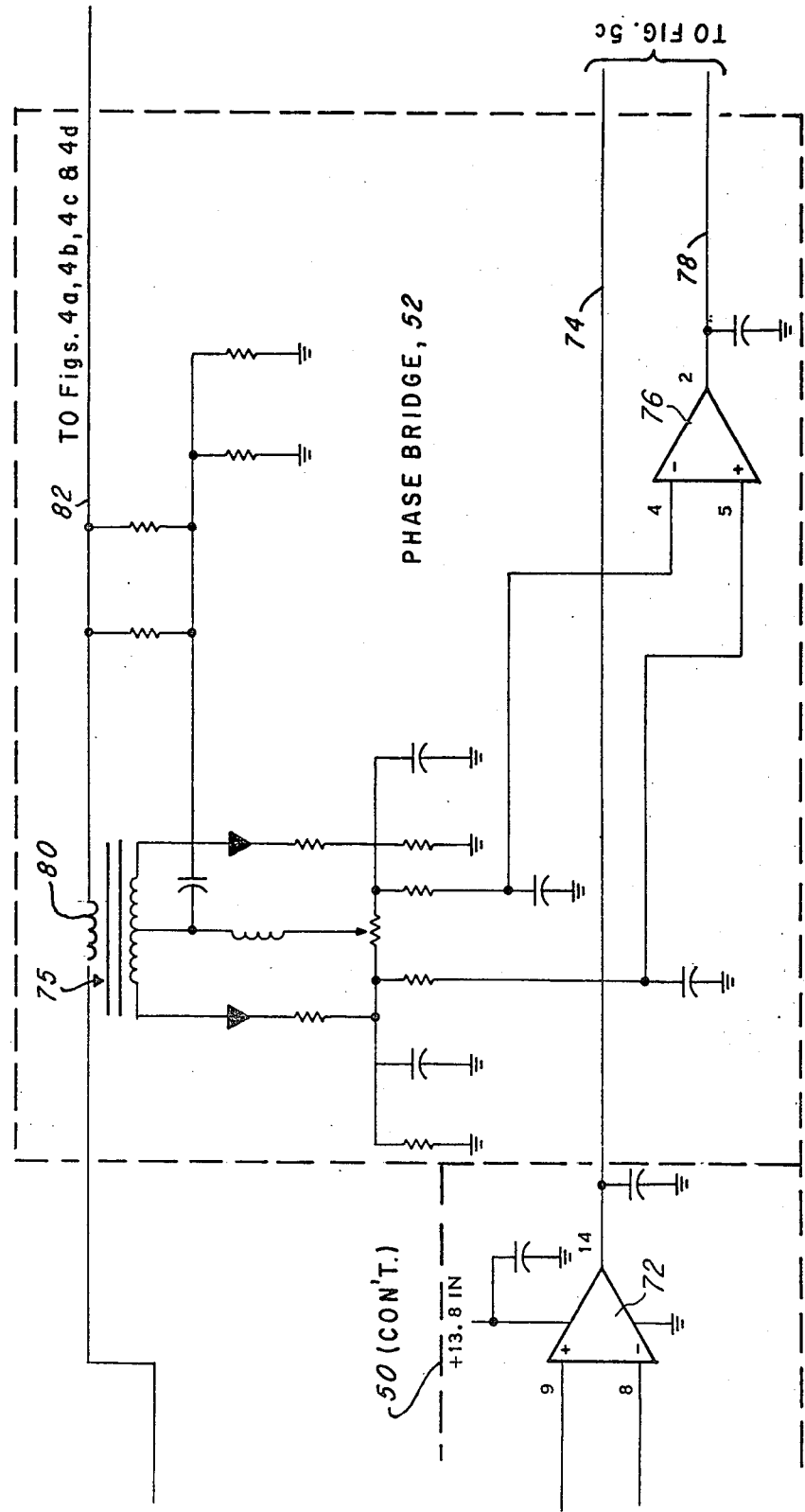

To tune the antenna initially, or to determine the tuned status of a selected channel and to tune the channel if necessary upon instruction of the main unit, a magnitude (Z) bridge 50, and a phase $\phi$ bridge 52 (FIGS. 3a and 3b) are provided. For activating the phase bridge, the microprocessor generates a high signal at terminal 56 (FIGS. 5e & 3a) and a low signal at terminal 62. The high signal at terminal 56 activates coil 60 (FIG. 3a) to close switch 54 to admit power through the antenna coupler input to the primary coil of transformer 75 (FIG. 3b) of the phase bridge 52; while, the low at terminal 62 (FIG. 3a) inactivates the magnitude bridge. Conversely, a high signal at terminal 62 activates coils 68 and 70 to close switches 64 and 66 to admit power through the antenna coupler 58 to the magnitude bridge 50, while the low at terminal 56 opens switch 54 to inactivate the phase brige 52.

In the magnitude bridge 50 (FIG. 3a) the transmitter power and the antenna power are processed and compared in comparator 72 (FIG. 13b) and a signal is connected through lead 74 as resistance data (R greater or less than the reference impedance, 50 ohms) through multiplexer 190 (FIG. 5c) to the microprocessor (FIGS. 5a and 5b).

Figure 4D:
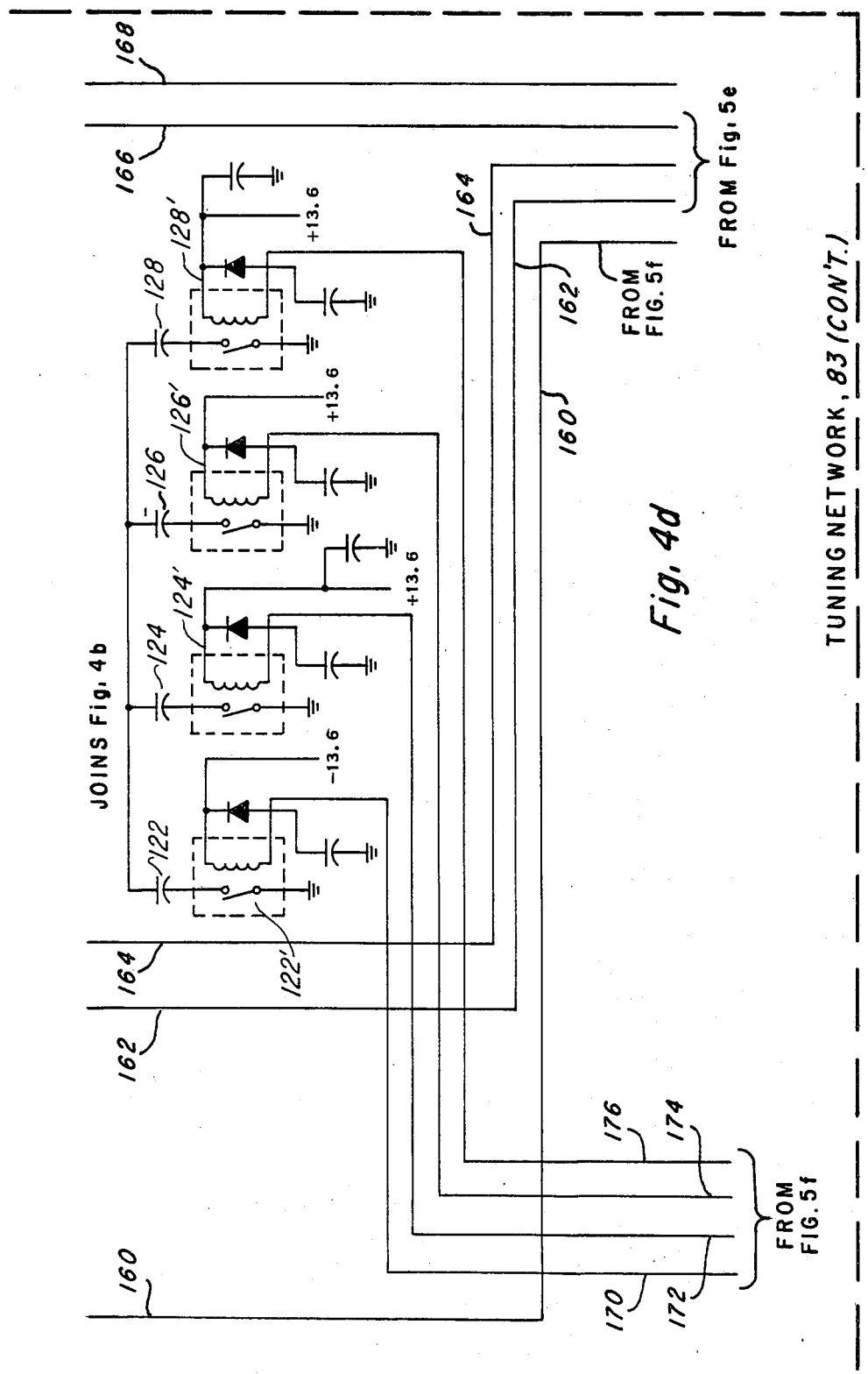
Figure 5D:
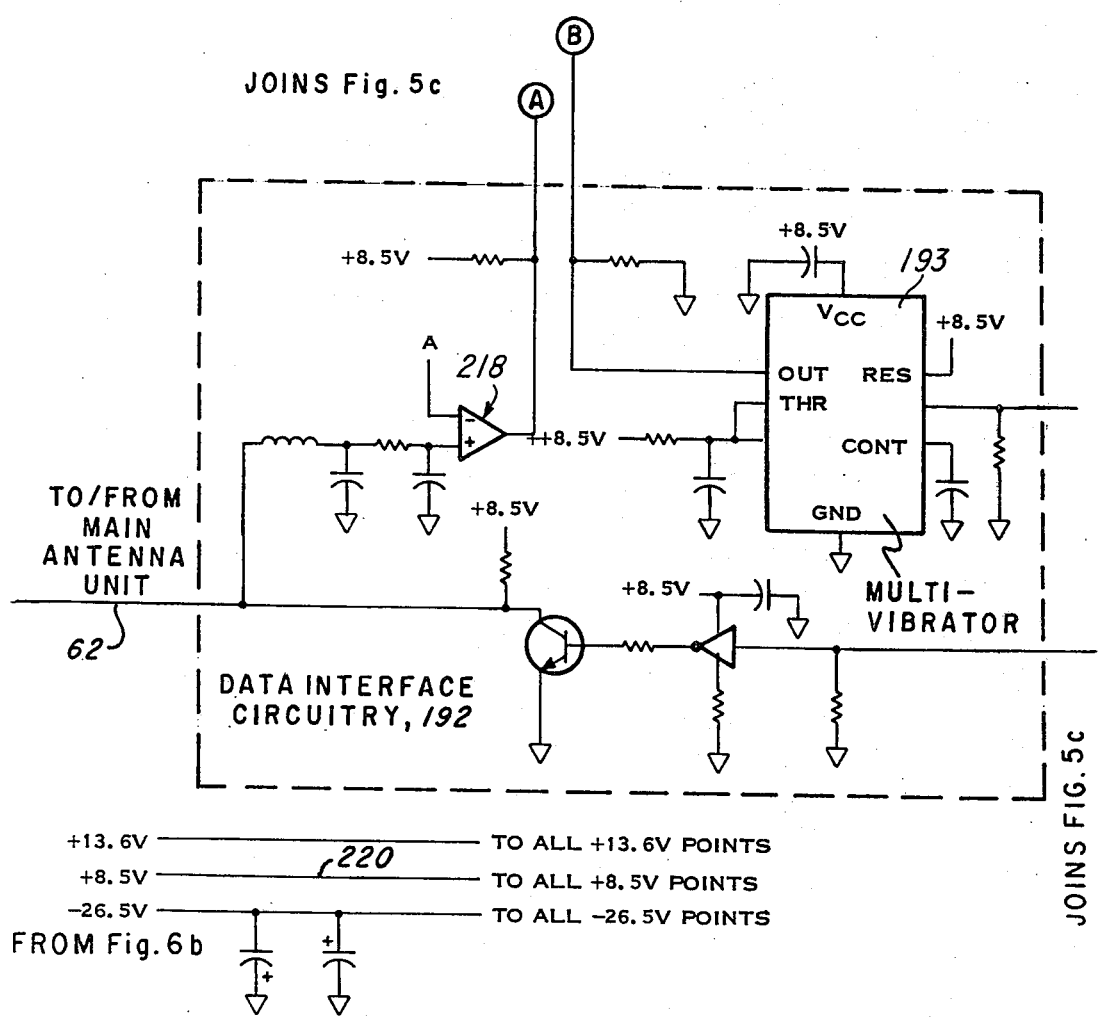
Figure 5E:
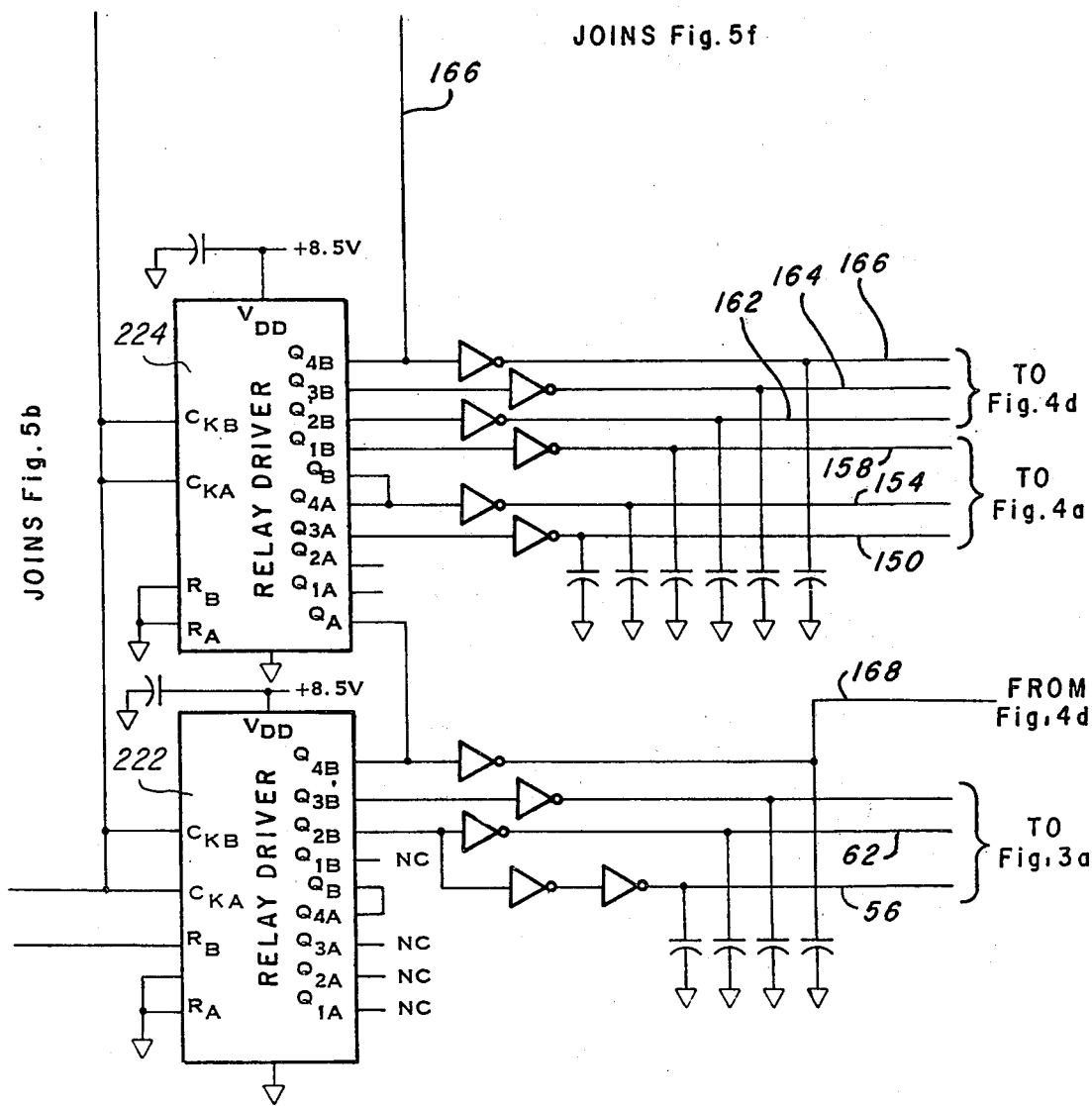
Figure 5F:
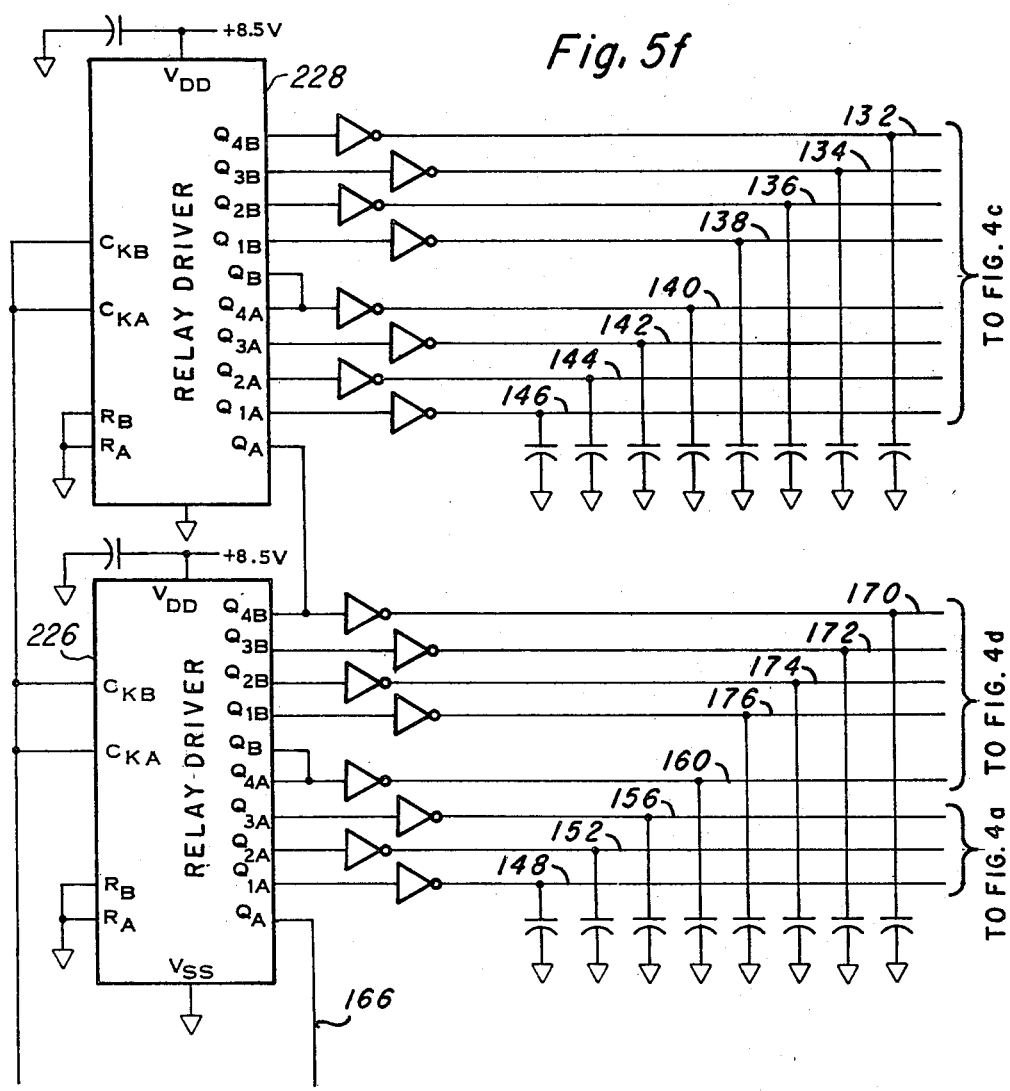

In the phase dectector bridge 52 (FIG. 3b), the transformer 75 provides the transmitter power and antenna power (39 ohms) for comparison in comparator 76. If positive, the antenna is inductive and if negative, it is capacitive. The information of the comparator output is connected by lead 78 through multiplexer 190 to the microprocessor (FIGS. 5c, 5a and 5b). The primary coil 80 (FIG. 3b) of the transformer 75 is connected by lead 82 to the junction (FIG. 4a) of a pi ($\pi$) tuning network 83 (FIGS. 4a, 4b, 4c and 4d) having a pluality of switchable inductors 102-120 connected in series (FIGS. 4a & 4b) with the antenna coupler input and a plurality of switchable shunt capacitors 86-100 (FIGS. 4a & 4c) positioned on the transmitter side of the plurality of inductors 102-120 and a second plurality of shunt capacitors 122-128 (FIG. 4d) connected to the antenna side of the series of inductors. These output capacitors are to bring the antenna impedance to where the inductance antenna coupler is in range regardless of which side of the inductors has a higher inductance. A series capacitor 130 (FIG. 4b) adapts the network for tuning the antenna for all cases. The shunt capacitors and series inductance are controlled by relays 86' and 130' connected by leads 132-176 (FIGS. 4c & 4d) to the microprocessor for control signals (FIGS. 5e & 5f). The output of the tuning network (FIG. 4b) is connected to antenna 180.

The microprocessor 182 (FIGS. 5a-5b), is for example, a TMS 1300 NLL, sold by Texas Instruments Incorporated. A crystal oscillator 184 (FIG. 5c) provides clock pulses to the microprocessor 182 (FIGS. 5a & 5b) and to a divide by 24 circuit 186 (FIGS. 5c & 5a). The divide by 24 circuit 186 is connected to the clock terminal of an electrically alterable read only memory (EA-ROM) 188 (FIG. 5a). An input multiplexer 190 (FIG. 5c) receives phase and magnitude information through leads 78 and 74, transmit d.c. (Tdc) and VSWR (5:1) information through leads 12 and 46, and antenna data from data interface circuitry 192 (FIG. 5d) having its input connected to antenna data terminal 62 (FIG. 5d). The microprocessor 182 (FIG. 5b) provides a signal through one shot multivibrator 193 (FIG. 5d) to multiplexer 190 (FIG. 5c) and a signal to the enable pins of the multiplexer 190 (FIG. 5c) and to flip flop 195 of the divide by 24 circuit 186 (FIG. 5a). The microprocessor is powered on with turn on of the system by a pulse received through lead 191 (FIG. 5c) which is present only when the proper power is available for microprocessor operation.

The microprocessor 182 (FIGS. 5a & 5b) has outputs connected through a driver 194 (FIG. 5b) to terminals as follow: PA BIAS 196, receiver (RX) 198, tansmit (Tx) 200, a first attenuator driver control (ADC) 202, a second ADC 204, and first, second and third low pass filters, respectively, 206, 208, and 210. Further the microprocessor has tuning data outputs (FIG. 5a) connected through NAND gates 212 to EAROM 188. EAROM 188 has an I/O terminal connected to the negative input terminal of comparator 214 and to the output of comparator 216 (FIG. 5a). The positive terminal of comparator 214, the negative terminal of comparator 216, the drivers of driver 194 (FIG. 5b) and the negative terminal of comparator 218 of the data interface circuit 192 (FIG. 5d) are connected to the +8.5 V power source terminal 220 (FIG. 5d). The positive input terminal of comparator 216 (FIG. 5a) is connected to an output terminal of the microprocessor. Thus, comparator 216 compares the microprocessor output to the reference voltage and comparator 214 compares the output of EAROM with the reference voltage. The output of comparator 214 is buffered and connected to input pin 12B of input multiplexer 190 (FIG. 5c).

Finally, the microprocessor 182 (FIG. 5b) has output pins connected, respectively, to the clock terminals and data terminals of a plurality of relay drivers 222, 224, 226, and 228 (FIGS. 5e and 5f) connected in cascade. Relay driver 222 (FIG. 5e) has outputs connected to the phase and impedance bridges selection relay terminals 56 and 62 (FIG. 3a); the transmit side shunt capacitor bank, and the series antenna side capacitor relay terminal 168 (FIGS. 4d & 4b). While relay driver 224 has its data terminal connected to an output terminal 168 of relay driver 222 and its output pins connected to the relay terminals 150, 154 and 158 of FIG. 4a, 162, 164, and 166 of FIGS. 4d and 4b of serial inductors 104, 108 and 112 of FIG. 4a and 116, 118, and 120 of FIG. 4b; and relay driver 226 (FIG. 5f) has its data pin connected to terminal 166 of relay driver 224 and output pins connected to relay terminals 148, 152 and 156 of FIG. 4a and 160 of FIGS. 4d and 4b of serial inductors 102, 106 and 110 of FIGS. 4a and 4b and 114 of FIG. 4b; and to relay terminals 170, 172, 174, and 176 of antenna side shunt capacitors 122, 124, 126, and 128 (FIG. 4d). Finally relay driver 228 (FIG. 5f) has its data pin connected to driver 226 output terminal 170 and output pins connected to relay terminals 132, 134, 136 and 138 of FIGS. 4d, 4c and 4a and 140, 142, 144 and 146 of FIGS. 4d and 4c of transmitter side shunt capacitors 86, 88, 90 and 92 of FIG. 4a and 94, 96, 98 and 100 of FIG. 4c.

Figure 6A:
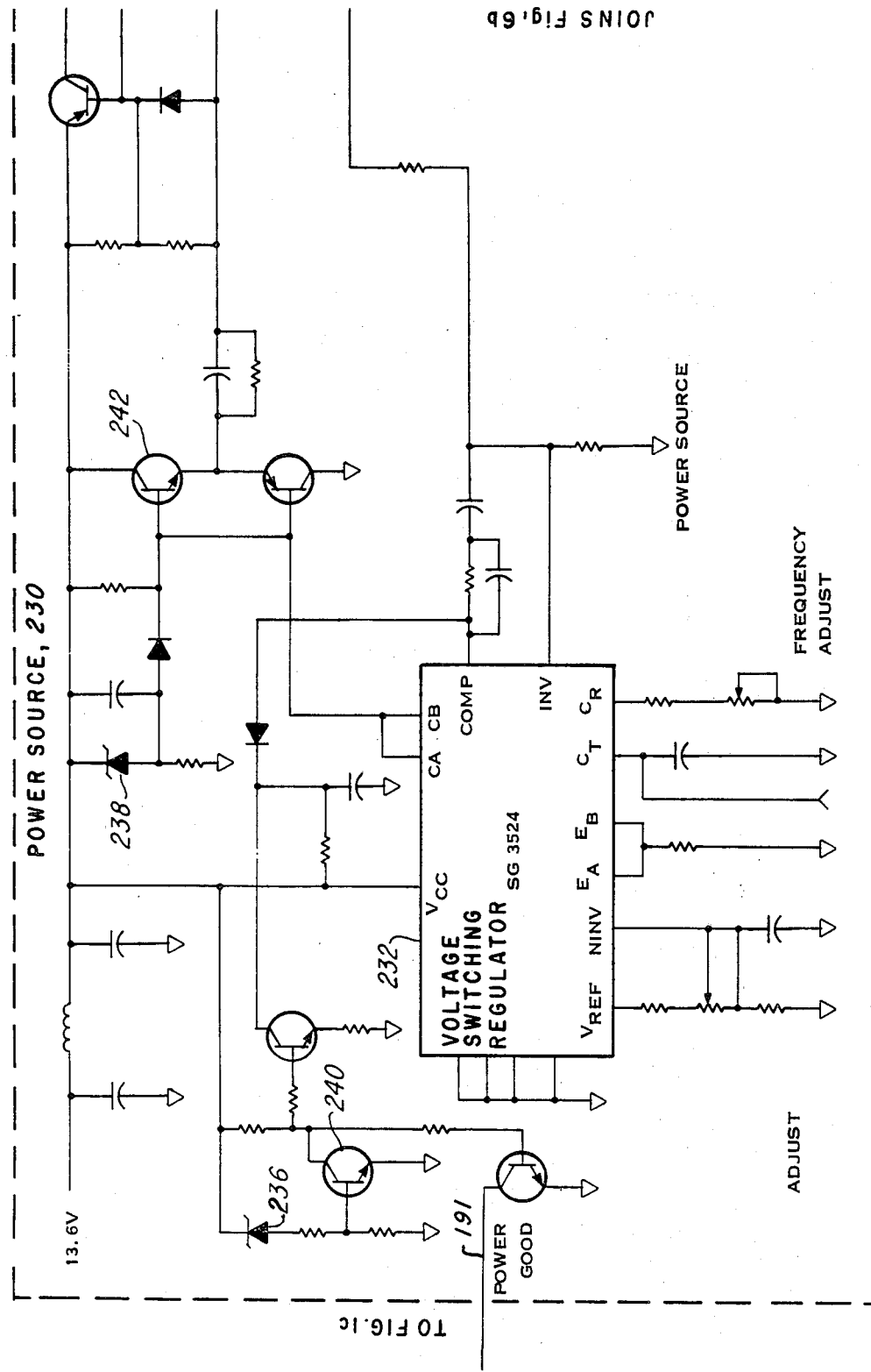
FIGS. 6a-6b are schematic diagrams of the antenna unit's power supply board.
Figure 6B:
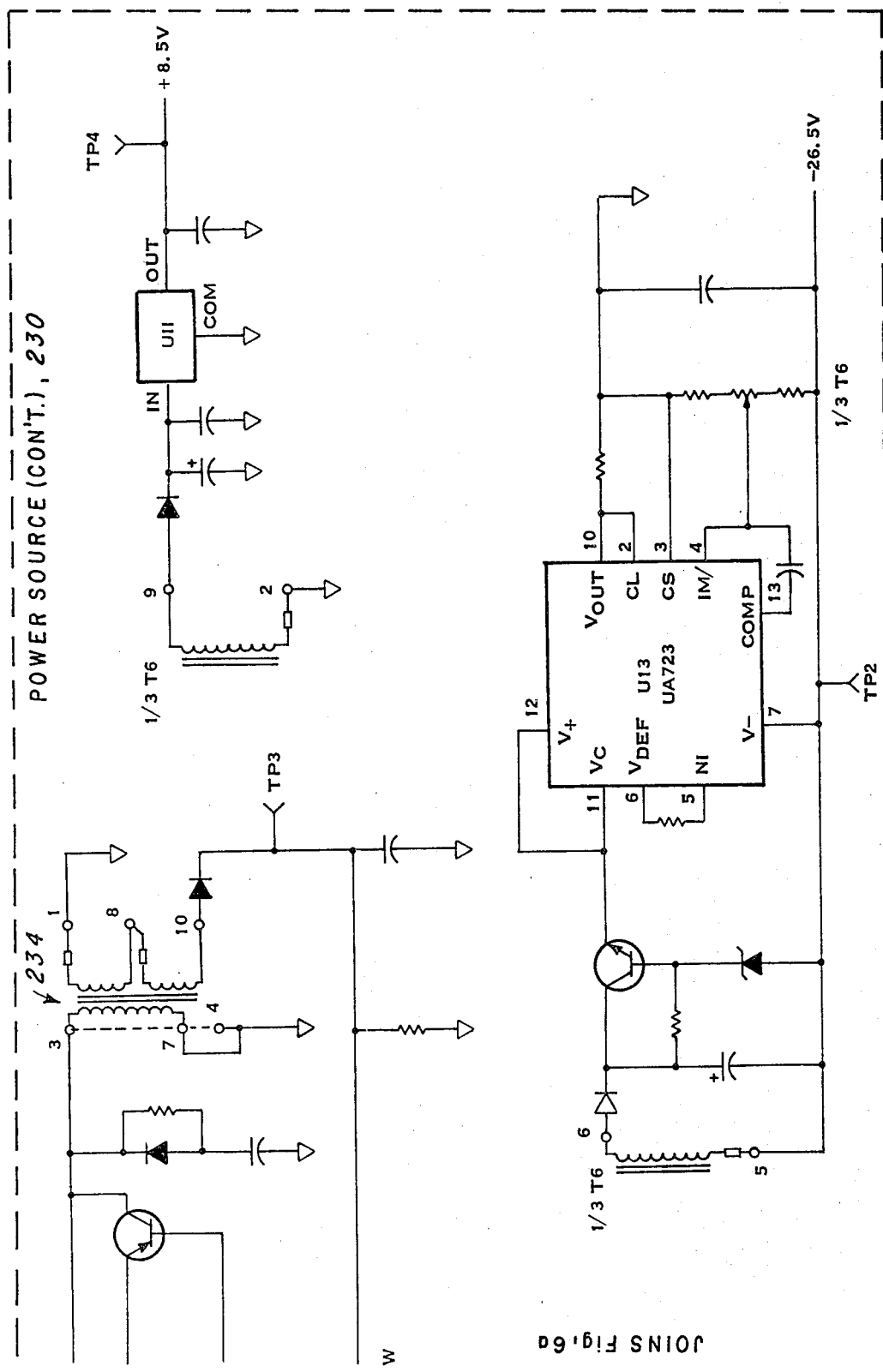

Power for the antenna unit is supplied by power source 230 (FIGS. 6a and 6b). The power source includes a voltage source of, for example, 13.6 V applied to a switching regulator 232 (FIG. 6a) and a transformer 234 (FIG. 6b). The transformer provides two preselected voltages +8.5 V and +26.5 V. The switching regulator 232 acts to maintain the voltages at predetermined values. To ensure proper voltages for the tuner, a zener diode circuit is provided which includes zener diodes 236 and 238 connected to the bases of transistor switches 240 and 242, respectively. The zener diodes output signals to the switches only when the power supply has a proper voltage. Thus, the switches are biased on only when the power supply is good. The zener diode circuit provides power good signals at terminal 191 only when the power supply has a proper voltage. Thus, the switches are biased on only when the power supply is good. The zener diode circuit provides power good signals at terminal 191 for the microprocessor (FIGS. 5c and 5a).

The data interconnect between the main unit (not shown) and the antenna is a length of coaxial cable having a length of a few feet to one hundred feet. Each end is terminated in a 270 ohm pull up resistor to a 5 volt bus and an open collector switch which is normally open. Hence, the interconnect is a wired—OR system. Additionally, a voltage sensor is located at each end of the data interconnect to provide input to the antenna unit's microprocessor.

In all modes of operation except transmit and match the main unit has control of the data interconnect. Information is put on the data bus by the main unit when: the main unit is turned on, a new channel is selected by the main unit, or an antenna matching function is initiated. After an initialization routine in the main unit has been completed after turn on, the last channel which was used is sent to the antenna unit.

The antenna unit, after sensing a positive start bit which lasts greater than 1.75 ms but less than 2.25 ms on the data interconnect, takes twenty samples which correspond in time to the center of each bit in the bit stream.

After taking the twenty samples, the antenna unit decodes an instruction field for two possible instructions: a channel update and a prepare to match.

If the eight bit field contains either instruction, the instruction register in the antenna unit is updated. If neither instruction is contained in the field, no update occurs.

Regardless of the instruction decode, twenty bits are sent from the antenna unit to the main unit for verification. If the word returned is not the same as the word sent, the main unit sends the word again. If after three tries a proper reply word has not been received, the main unit continues its operation with the transmit function on that channel inhibited.

The total antenna unit data word consists of a start (high) bit of a selected duration (2.0 ms) followed by a low bit (1 ms); a four bit data field which contains the MSD of the channel address in BCD, MSB first; a four bit data field which contains low pass filter information LP1-LP4; and an eight bit instruction field which contains two possible instruction codes—a channel update code and a match code.

In transmit operation, after the antenna unit successfully echos back the antenna data word, the antenna unit continues to monitor two inputs, the data input and the transmit d.c. (TDC) which is an input provided by the power amplifier board derived from the RF interconnect cable.

If a data input appears on the data interconnect, the information is processed, the instruction register updated, and the word echoed back to the main unit.

If a TDC input appears, this tells the antenna unit to switch into the transmit mode of operation. The current instruction word is examined to determine whether a normal transmit will be occurring (the antenna unit is simply an amplifier to the main unit drive signal) or whether a match routine is used (the main unit putting out a constant signal and the antenna unit actively following a specific instruction sequence).

For either instruction, the antenna unit first switches into the transmit mode of operation by arranging the relays at the input and output of the power amplifier so that the exciter signal will be amplified, enabling the power amplifier bias circuitry, and setting the desired automatic level control (125 W setting).

The instruction register then tells the antenna unit whether to simply wait for a drive RF signal for as long as TDC is high or to delay for 200 ms and begin the match routine.

If the normal transmit function is pursued, the exciter will put out a drive signal at some later time, depending upon the operator. This signal is amplified by the power amplifier to the desired level (125 W) and routed to the antenna. At this time the antenna is continually monitoring the TDC line. When this line goes low, the antenna unit switches back to the standby (receive) mode.

Additionally, the antenna unit monitors the SWR bridge output from the power amplifier board. This output is a logic 1 whenever an SWR greater than 5:1 exists and an adequate power level is present to take a measurement. If a logic 1 is sensed, the antenna unit raises the data interconnect line high, telling the main unit that a high SWR exists and a "Tune" indicator on the main unit front.

If the instruction code to begin the match operation has been stored in the instruction register, the TDC line will switch the antenna unit into the transmit mode, examine the instruction register, and branch into the match subroutine after delaying a selected time (200 ms). This delay allows the exciter drive to appear before the match algorithm begins. At this point, neither unit controls the data bus and there are three possible outcomes—the match operation is completed successfully, match operation completed but match is not possible or the antenna unit crashes.

At the completion of a successful match when an SWR of less than 5:1 is achieved, the antenna unit pulses the data connect high for a short time (5 ms) and releases the bus. If a match was not successful but the algorithm was completed, the data ineterconnect is pulsed high for a short time (2 ms). Upon sensing this, the main unit will turn off the exciter driver and revert to the receive mode blanking the "Tune" light on the front panel for an unsuccessful match until another command is entered.

If for some reason no reply is received within eight minutes, the main unit will again turn off the excitor drive and revert to receive mode, blinking the "Tune" light as before.

When the antenna unit has completed the match algorithm successfully, the resultant switch settings are stored in the EAROM. If a default occurred, the EAROM contents remain unchanged. In either case, the instruction word in the instruction register is changed to "channel update," the signal sent out to the main unit (2 ms or 5 ms) and the normal transmit mode re-entered until TDC falls.

At this point, the antenna unit switches into the standby (receive) mode and continuously examines the TDC line and the data interconnect line for instructions.

With the "Tuner" light on the front panel flashing, the operator is alerted to push the tune buttom and the channel selected is tuned. The flow diagram (FIGS. 7a, 7b, and 7c) for the antenna unit operation is as follows:

When the main unit is powered on, a start up signal enters 244 (FIG. 7a) the antenna unit, and a decision 246 made whether the phase bridge output is positive (inductance) or negative (capacitance). If positive, a decision 248 is made as to whether all the transmitter side capacitance (TC) has been added. If no, additional TC is added 250 incrementally. After each addition, a decision 252 is made whether the phase bridge output is positive or negative. If positive, the cycle is returned to step 248. If all the TC has been used, a decision 254 is made whether all the series antenna side capacitance (SAC) has been used. If yes, the system indicates a default 256; if no, additional SAC is added 258, the TC is reset 260 to zero, and the cycle step 246 repeated.

Figure 7A:
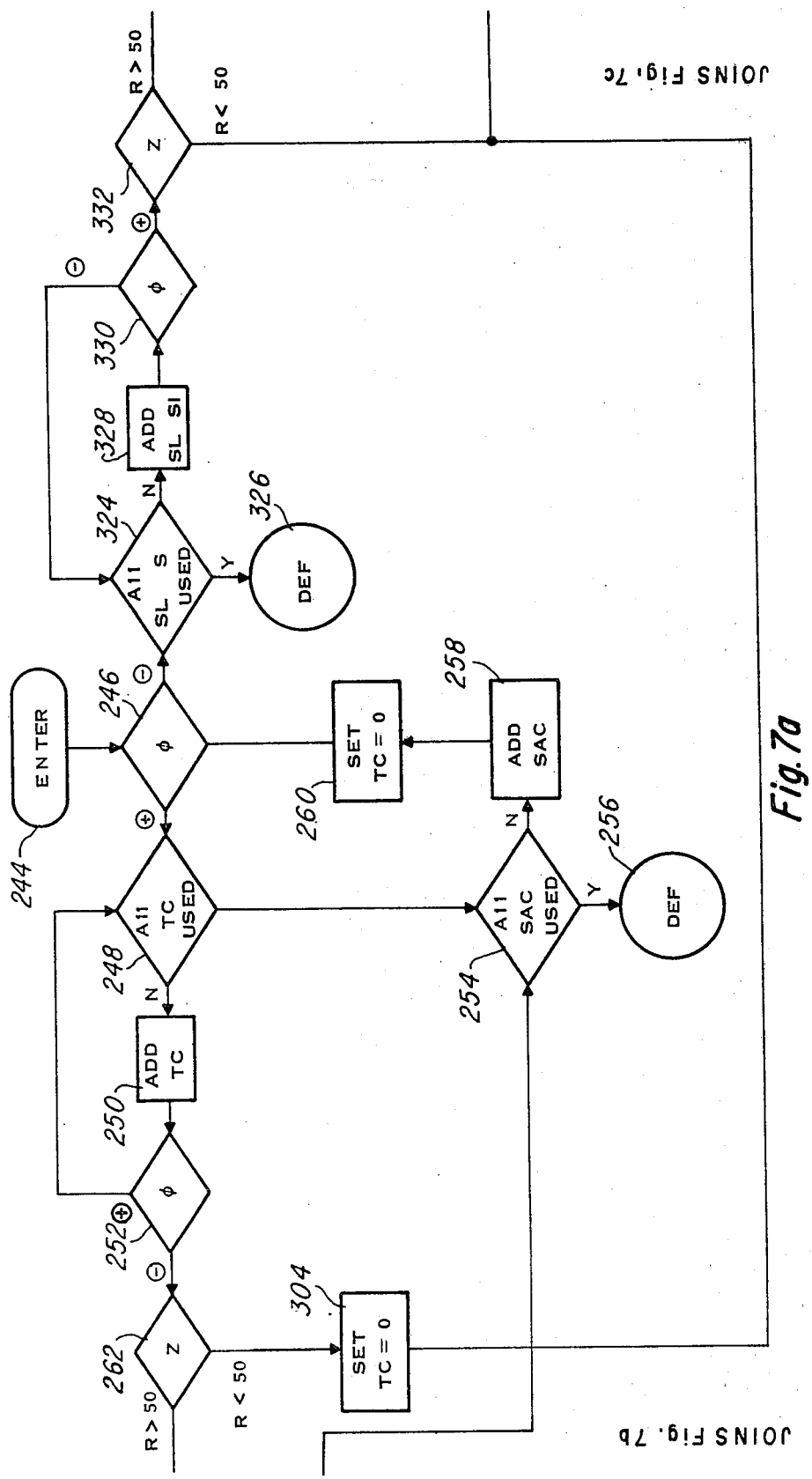
FIGS. 7a-7c depict the flow diagram for the antenna units microprocessor.
Figure 7B:
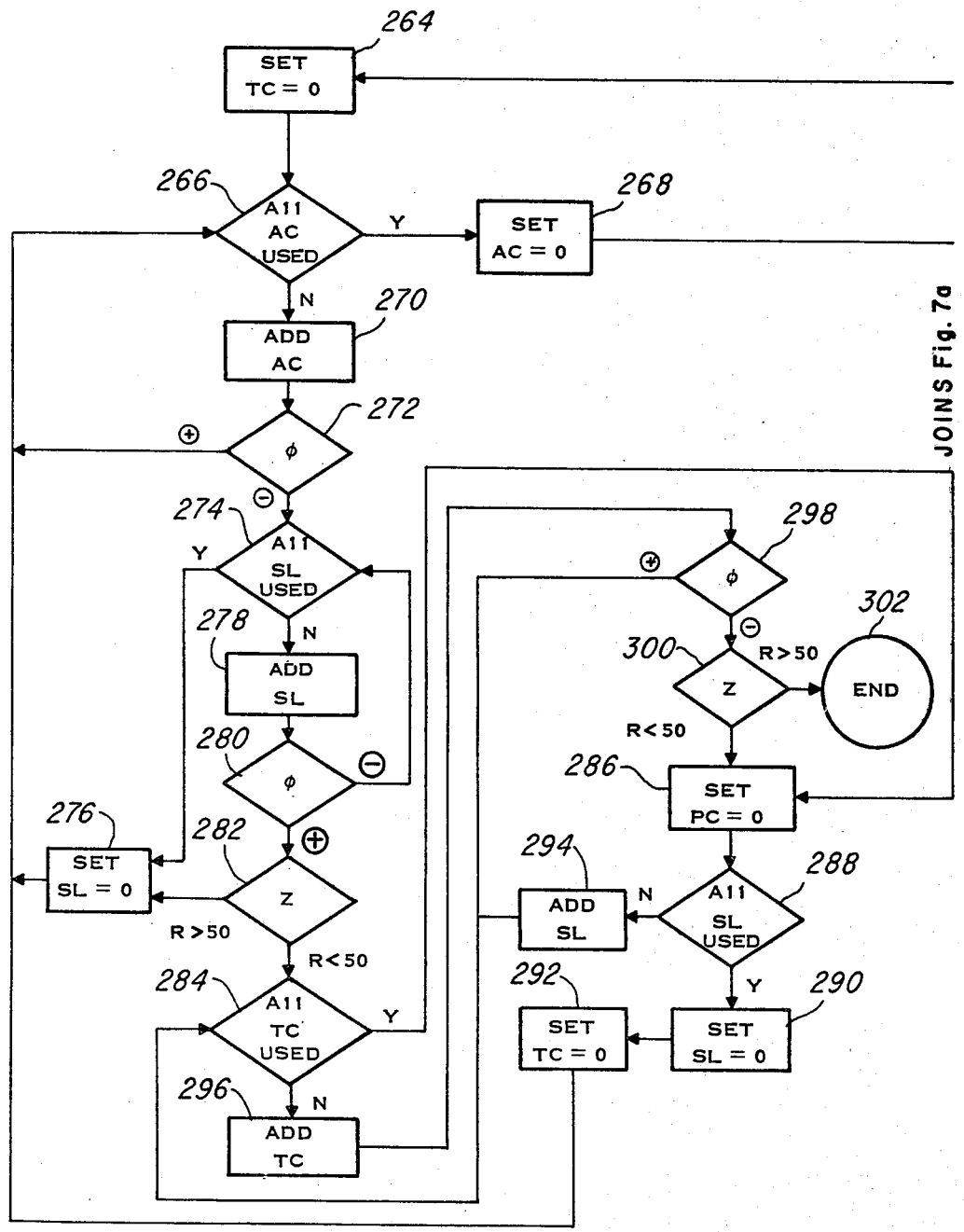
Figure 7C:
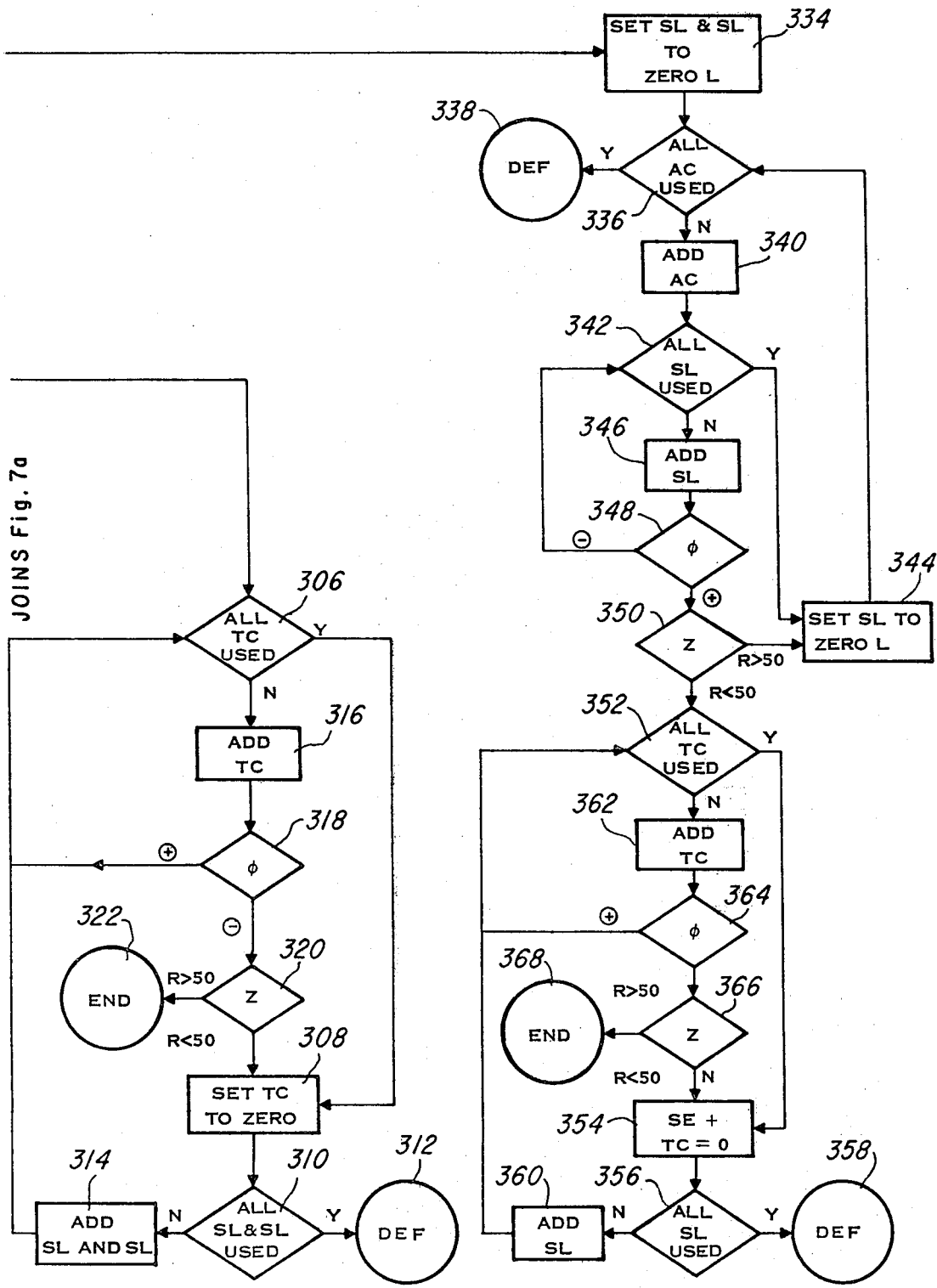

Returning to the phase bridge output decision step 252, if the decision is negative, a decision 262 is made whether the output of the impedance bridge is greater than or less than fifty ohms. If greater than fifty ohms, the TC is set to zero 264 (FIG. 7b) and a decision 266 made whether all antenna side capacitance (AC) has been used. If yes, the AC is set to zero 268 and the cycle continued from decision step 254 (FIG. 7a). If no, AC is added 270 (FIG. 7b) and a decision 272 made whether the phase bridge output is positive or negative. If positive, the cycle returns to decision step 266; if negative, a decision 274 is made whether all SL has been used. If yes, the SL is set to zero 276 and the cycle returned to decision step 266; if no, SL is added 278 and a decision 280 made whether the phase bridge output is positive or negative. If negative, the cycle is returned to decision step 274; if positive, a decision 282 is made whether the impedance bridge output is greater than or less than fifty ohms.

If greater than fifty ohms, the SL is set to zero 276 and the cycle returned to decision step 266; if less than fifty ohms, a decision 284 is made whether all TC has been used. If yes, the TC is set to zero 286 and a decision 288 made whether all the SL has been used. If yes, the SL is set to zero 290 and the TC is set to zero 292 and the cycle returned to step 266; if no, SL is added 294 and the cycle returned to decision step 284. If the decision step 284 is negative, TC is added 296 and a decision 298 made whether the phase bridge output is positive or negative. If positive, the cycle returns to the decision step 284; if negative, a decision 300 is made whether the impedance bridge output is greater than or less than fifty ohms. If less than fifty ohms, the TC is set to zero 286 and the cycle continued therefrom, if greater than fifty ohms, the selected channel is tuned (SWR less than 5:1) and the cycle ends 302.

Returning now to the impedance bridge output decision step 262 (FIG. 7a) if the decision is less than fifty ohms, the TC is set to zero 304 and a decision 306 (FIG. 7c) made whether all TC has been used. If yes, the TC is set to zero 308 and a decision 310 made whether all the SL and SL' has been used. If yes, the system indicates default 312; if no, series inductance SL and additional series inductance SL' are added 314 and the cycle returned to step 306. If all the TC has not been used, TC is added 316 and a decision 318 made whether the output of the phase bridge is positive or negative. If positive, the cycle returns to decision step 306; if negative, a decision 320 is made whether the output of the impedance bridge is greater than or less than fifty ohms. If less than fifty ohms, the cycle cotinues with step 308; if greater than fifty ohms, the selected channel is tuned and the cycle ends 322.

Returning now to the original phase bridge positive or negative decision 246 (FIG. 7a), if the decision is negative, a decision 324 is made whether all SL and SL' has been used. If yes, the system indicates default 326; if no, SL and SL' are added 328 and a decision 330 made whether the phase bridge output is positive or negtive. If negative, the cycle returns to decision step 324; if positive, a decision 332 is made whether the impedance bridge output is greater than or less than fifty ohms. If less than fifty ohms the cycle continues through decision step 306 (FIG. 7c); if more than fifty ohms, the SL and SL' are set to zero 334 (FIG. 7c) and a decision 336 made whether all AC has been used. If yes, the system indicates default 338; if no, AC is added 340 and a decision 342 made whether all SL has been used. If yes, the SL is set to zero 344 and the cycle returned to step 336; if no, SL is added 346 and a decision 348 made whether the phase bridge output is positive or negative. If negative, the cycle is returned to decision step 342; if positive, a decision 350 is made whether the output of the impedance bridge is greater than or less than fifty ohms. If greater than fifty ohms, the SL is set to zero 344 and the cycle returned to step 336; if less than fifty ohms, a decision 352 is made whether all TC has been used. If yes, the TC is set to zero 354 and a decision 356 made whether all SL has been used. If yes, the system indicates default 358; if no, SL is added 360 and the cycle returned to decision step 352. If decision step 352 (whether all TC has been used) is negative, TC is added 362 and a decision 364 made whether the phase bridge output is positive or negative. If positive, the cycle returns to decision step 352; if negative, a decision 366 is made whether the impedance bridge output is greater than or less than fifty ohms. If less than fifty ohms, the cycle continues through step 354; if greater than fifty ohms, the selected channel is tuned and the cycle ends 368.

Although only a single embodiment of the invention has been described herein, it will be apparent to a person skilled in the art that various modifications to the details of construction shown and described may be made without departing from the scope of this invention.

What is claimed:

1. An antenna tuner comprising:
   a. a transceiver and an antenna
   b. an antenna coupler circuit interconnecting the antenna to the transceiver said circuit including a capacitance and inductance network means for selectively loading the antenna;
   c. phase bridge means for comparing the transmitter power and antenna power for producing selectively an inductive and capacitive antenna indicating signal;
   d. magnitude impedance bridge means for comparing the transmitter power and antenna power for producing selectively a signal indicative of a load resistance greater than and less than the characteristic impedance of the antenna; and
   e. computer controller means connected to the means for determining whether an antenna is inductive or capacitive, and to the means for determining whether the load resistance is greater than or less than the characteristic impedance of the antenna and to the capacitance and inductance means for tuning the antenna by selectively coupling capacitance and inductance into the antenna coupler circuit responsive to inductive or capacitive indicating signals and load resistance greater than or less than the characteristic impedance of the antenna indicating signals.

2. An antenna tuner according to claim 1 wherein the capacitance and inductance network means includes a plurality of inductors connected in series and a plurality of switches for selectively connecting the inductors into the antenna coupling circuit, a first plurality of shunt capacitors, and a first plurality of switches for selectively connecting the shunt capacitors into the antenna coupling circuit at the transceiver side of the antenna coupling circuit, a second plurality of shunt capacitors and a second plurality of switches for selectively connecting the shunt capacitors into the antenna coupling circuit at the antenna side of the antenna coupling circuit, and an additional capacitor connected to the junction of the second end of the plurality of inductors and the second plurality of shunt capacitors for adapting the capacitance and inductance network for tuning the antenna for all cases.

3. An antenna tuner according to claim 1 wherein the control means further includes a memory for storing the channel tuning values of the lumped capacitance and inductance connected into the antenna coupler circuit.

4. An antenna tuner according to claim 1 further including a low pass filter network connected between the transceiver transmitter output and antenna coupler circuit for attenuating transmitter harmonics for a selected channel frequency.

5. An antenna tuner according to claim 1 further including VSWR circuit connected between the transceiver and antenna coupler circuit for determining whether a preselected VSWR is exceeded by the VSWR of an antenna to provide additional VSWR information to the control means for checking the tuning.

6. An antenna tuner according to claim 1 further including a power amplifier connected between the transceiver and antenna coupling circuit for selectively amplifying the power output of the transceiver during transmission.

7. An antenna tuner according to claim 6 further including an RF detector circuit connected between the transceiver and the power amplifier circuit for determining the rate of decay of the automatic level control for sustaining attenuator levels during RF lapses.

8. An antenna tuner according to claim 7 further including an attenuator circuit connected to the power amplifier and control means for controlling the power output of the power amplifier.

9. An antenna tuner according to claim 3 wherein the memory is a nonvolatile electrically alterable memory for storing and retaining the channel tuning values during turnoff.

10. An antenna tuner comprising:
   a. a transceiver;
   b. a dc filter 10 operatively connected to the transceiver for removing any RF signals, a voltage comparator 18 and an antenna unit 8 operatively connected to the dc filter output, said voltage comparator for comparing the dc output to a reference voltage and selectively outputting a transmit signal, and said antenna unit providing a power on/off signal;
   c. a control means 182 operatively connected to the transmit output terminal of the voltage comparator for receiving the transmit signal and selectively outputting a bias signal;
   d. a power bias and voltage regulator circuit 20 including a transistor switch 21 for controlling the voltage during transmit and receive, said transistor having an emitter connected to the power on/off signal of the antenna unit, a base connected to the bias signal of the control means, and a collector, first and second voltage regulators 23 & 25, said first voltage regulator 25 connected to the collector of the transistor switch for providing a first preselected voltage and said second voltage regulator 23 connected to the antenna unit for providing a second preselected voltage;
   e. a power amplifier 28 operatively connected to the first and second preselected voltages of the power bias and voltage regulator circuit for selectively turning on and off the power amplifier;
   f. a transmit switch 30 operatively connected to the transceiver and control means;

g. an attenuator 43 and an RF detector 36 operatively connected between the transmit switch and power amplifier, said attenuator for adjusting the energy supplied to the power amplifier for transmit; said RF detector being operative for searching the transceiver output for RF signals and selectively outputting an RF present signal, a sample and hold circuit 38 connected to the RF detector for generating a fast attenuator time constant signal when no RF is detected after a preselected time and a reset signal, an attenuator driver 40 connected to the sample and hold fast attenuator time constant signal output and to the control means for providing a power selective signal to the attenuator 43 for selectively controlling the power output of the power amplifier, a ramp control circuit 22 connected to the sample and hold circuit reset terminal for resetting ramp control circuit to its original state in response to the reset signal output of the sample and hold circuit, said ramp control circuit operatively connected to the power amplifier for controlling the rate of power amplifier turn on commensurate to the ALC operation;

h. a transmit/receive switch (32) operably connected to the control means, said T/R switch incuding a first switch 34 connected to the transceiver for bypassing the power amplifier during receive, and a second switch 31 connected to the output of the power amplifier, said second switch 31 coacting with the transmit 30 in response to the control means to selectively switch in the power amplifier during transmit;

i. a low pass filter network 42 including a plurality of filters and a plurality of switches operably connected to the control means for selectively connecting the filters into the transmit/receive switch for channel frequency selection;

j. a VSWR circuit 44 operatively coupled to the output of the low pass filter network, said VSWR circuit for sampling the reflected power and the forward power in a comparator and selectively outputting a signal indicating whether the VSWR exceeds a preselected ratio;

k. an antenna coupler circuit 58 including a tuning means 83 operatively connected to the output of the low pass filter network, said tuning means having a plurality of inductors 102-120 and a plurality of switches connected to the control means for selectively connecting the inductors in series into the antenna coupler circuit in response to signals from the control means, a first plurality of shunt capacitors 86-100 and a first plurality of switches connected to the control means for selectively connecting the shunt capacitors into the antenna coupler circuit on the transceiver side of the plurality of inductors in response to signals from the control means, and a second plurality of shunt capacitors 122-128 and a second plurality of switches connected to the control means for selectively connecting the shunt capacitors into the antenna coupler circuit on the antenna side of the plurality of inductors in response to signals from the control means;

l. a magnitude impedance bridge 50 operatively coupled to the antenna coupling circuit and control means for comparing the transmitter power and the antenna power for selectively outputting a signal to the control means indicative of an antenna impedance above or below a reference impedance; and m. a phase detector bridge 52 operatively coupled to the antenna coupler circuit and control means for comparing the transmitter power and antenna power for selectively outputting to the control means a signal indicating whether the antenna is inductive or capacitive; whereby said control means in response to the outputs of the magnitude impedance bridge and the phase detector bridge selectively outputs signals to the plurality of switches for the plurality of inductors, and first and second plurality of switches for the first and second plurality of shunt capacitors for selectively connecting inductors and shunt capacitors into the antenna coupling circuit until the antenna is tuned, and said control means indicates the tuning thereof to the transceiver.

* * * * *